United States Patent [19]
Welch et al.

[11] Patent Number: 5,539,571
[45] Date of Patent: Jul. 23, 1996

[54] DIFFERENTIALLY PUMPED OPTICAL AMPLIFER AND MOPA DEVICE

[75] Inventors: David F. Welch, Menlo Park; Donald R. Scifres, San Jose; Robert G. Waarts, Palo Alto; David G. Mehuys, Sunnyvale, all of Calif.; Amos A. Hardy, Tel Aviv, Israel; Ross A. Parke, Fremont, Calif.

[73] Assignee: SDL, Inc., San Jose, Calif.

[21] Appl. No.: 202,359

[22] Filed: Feb. 28, 1994

Related U.S. Application Data

[63] Continuation-in-part of Ser. No. 948,673, Sep. 21, 1992, abandoned.

[51] Int. Cl.⁶ .................................................. H01S 3/00
[52] U.S. Cl. .................................................. 359/344
[58] Field of Search ............................ 359/344, 333; 372/43, 50

[56] References Cited

U.S. PATENT DOCUMENTS

| | | | |
|---|---|---|---|
| 4,713,821 | 12/1987 | Bradford et al. | 372/44 |
| 4,744,089 | 5/1988 | Montroll et al. | 372/50 |
| 4,965,525 | 10/1990 | Zah | 330/4.3 |
| 5,003,550 | 3/1991 | Welch et al. | 372/50 |
| 5,021,742 | 6/1991 | Jacob | 330/4.3 |
| 5,029,297 | 7/1991 | Halemane et al. | 330/4.3 |
| 5,050,175 | 9/1991 | Ayral et al. | 372/21 |
| 5,103,456 | 4/1992 | Scifres et al. | 372/50 |
| 5,175,643 | 12/1992 | Andrews | 359/339 |

OTHER PUBLICATIONS

M. K. Shams et al., "Monolithic integration of GaAs—(GaAl) As light modulators and distributed–Bragg–reflector lasers", Applied Physics Letters 32(5), Mar. 1, 1978, pp. 314–316.

J. M. Haake et al., "Charactertization of GRIN–SCH–SQW Amplifiers", SPIE vol. 1418 Laser Diode Technology and Applications (1991), pp. 298–308.

M. S. Zediker et al., "Design optimization of a 10–amplifier Coherent Array", SPIE vol. 1418 Laser Diode Technology and Applications III (1991), pp. 309–315.

*Primary Examiner*—Mark Hellner
*Attorney, Agent, or Firm*—Schneck & McHugh

[57] ABSTRACT

An optical amplifier semiconductor device which is differentially pumped and a master oscillator power amplifier (MOPA) device employing such an amplifier. The amplifier allows the light propagating therein to diverge along at least part of its length, and may be a flared amplifier having a gain region that increases in width toward its output at a rate that equals or exceeds the divergence of the light. The amplifier is pumped with a current density at its input end which is smaller than the current density used to pump the output end for maintaining coherence of the beam to high power levels. Differential pumping may be both longitudinal and lateral within the amplifier. A single mode preamplifier section may be optically coupled to the input end of the amplifier. The amplifier input may have a width which is the same as or wider than that of the preamplifier output. The preamplifier may have a constant mode width or may be tapered to alter the divergence of the beams provided to the amplifier section. The laser oscillator in the MOPA device may be a single mode DBR laser diode monolithically integrated on the same substrate as the optical amplifier. Laser sources external to an amplifier chip may also be used. The input portion of the amplifier or the preamplifier section, if present, may be modulated. The laser oscillator might also be modulated if it has a high Q cavity. Tunable laser oscillators are also disclosed.

142 Claims, 13 Drawing Sheets

DIFFERENTIALLY PUMPED OPTICAL AMPLIFER AND MOPA DEVICE

STATEMENT AS TO RIGHTS TO INVENTIONS MADE UNDER FEDERALLY-SPONSORED RESEARCH ADD DEVELOPMENT

This invention was made with government support under Contract Nos. F29601-90-C-0028, F29601-91-C-0012 and F29601-92-C-0008, all awarded by the Department of the Air Force. The government has certain rights in the invention.

CROSS-REFERENCE TO RELATED APPLICATION

This is a continuation-in-part of Ser. No. 7/948,673, filed Sep. 21, 1992, abandoned.

TECHNICAL FIELD

The present invention relates to broad emitter optical power amplifiers, and to monolithically integrated, master oscillator power amplifier (MOPA) devices having such amplifiers. In particular, the invention relates to the manner of exciting or pumping such amplifiers and MOPA devices.

BACKGROUND ART

In U.S. Pat. No. 4,713,821, Bradford et al. describe a MOPA with discrete oscillator and amplifier elements. The MOPA includes a semiconductor laser diode having an output facet optically coupled to an optical power amplifier. The diode and amplifier are formed together as a single integral crystal, then cleaved to form a crack or division between the two. The diode and amplifier remain essentially a single unit in optical alignment with only a slight longitudinal shift resulting from the cleave. The active region at the entrance to the amplifier has the same lateral dimension as the active region at the exit of the laser diode, and the lateral dimension increases linearly in the forward direction toward the exit facet. The exit facet of the amplifier is antireflection coated.

In U.S. Pat. No. 4,744,089, Montroll et al. describe an improved MOPA structure which requires no cleaving into separate laser and amplifier elements, and is therefore monolithic. A laser diode has a periodic grating providing distributed feedback. A power amplifier with a diverging active area follows the laser, and the amplifier output facet is made antireflecting. The laser and amplifier are formed with separate electrical contacts so they can be driven by independent current sources.

In U.S. Pat. No. 5,003,550, Welch et al. describe a monolithic MOPA device having a steerable output beam. The device includes a single mode diode laser with distributed Bragg reflector (DBR) gratings, an optical amplifier disposed in tandem with the laser and a detuned second order grating surface output coupler disposed to receive the amplified light, all formed on a common substrate. The diode laser is tunable by means of a separate tuning current $I_t$ applied to the rear DBR grating. The amplifier is a flared waveguide coupled to receive the laser output and electrically pumped to provide optical power gain to the received light. In an alternate embodiment, the amplifier is a power splitter network of branching single mode waveguides coupled at y-junctions. The branched waveguides are followed by an array of single mode gain waveguides. The power splitter portion is pumped to compensate for scattering and splitting losses at the y-junctions, while the single mode gain waveguides are pumped to provide an optical power gain to the lightwaves. Tuning the laser, in conjunction with the surface output coupler grating, produces a longitudinal steering of the output beam. Lateral phase controllers having an array of separately addressed electrodes may be incorporated between the amplifier output and the surface output coupler to adjust the optical path length in order to enable compensation for lateral phase variations in the amplifier and to provide lateral steering of the output beam.

In U.S. Pat. No. 5,175,643, Andrews describes a monolithic MOPA device having a laser diode and preamplifier section, both with a single mode waveguide of constant width throughout, followed by a flared amplifier section increasing in width at a constant rate of flare. The laser diode, preamplifier section, and flared amplifier section are independently supplied with pumping current applied to separate contacts. The preamplifier section is modulated instead of the laser diode to avoid "chirping". The preamplifier section may also be used as a phase controller, a variable gain device for the laser or to saturate the gain at the input end of the flared amplifier section. The flared amplifier section has a single contact and so a uniform current density is applied over the entire flared amplifier.

In U.S. Pat. No. 4,965,525, Zah describes an optical amplifier having an index guided waveguide oriented so that its longitudinal axis is at a nonperpendicular angle relative to the cleaved facets. The facets are antireflection coated. The "slanted" waveguide has a relatively long straight middle portion supporting propagation of only a single spatial mode and two flared portions in the immediate vicinity of the facets. The mode width in the flared waveguide portions gradually increase from the straight portion towards the facets. In operation, the slanted orientation of the waveguide keeps internal light reflected by the facets from coupling back through the waveguide, thereby suppressing self-resonance by the amplifier. The flaring of the waveguide at its ends allows the waveguide to be formed with a greater slant angle without causing an increase in coupling losses for light input into the amplifier.

An object of the invention is to provide an optical amplifier with efficient, high power, coherence-maintaining amplifier operation together with reduced lensing or other phase distortions in broad area portions of the amplifier.

Another object of the invention is to provide an amplifier with improved modulation characteristics at high power.

A further object of the invention is to provide a MOPA device incorporating such optical amplifiers.

DISCLOSURE OF THE INVENTION

The above objects have been met with an optical amplifier which is differentially pumped. Instead of being pumped with a uniform current density over its entire length, the amplifier is pumped with a reduced current density at its input end relative to its output end. This variation along the direction of light propagation in the amplifier of the current injection into the amplifier improves the high power coherent operation of the amplifier. Though the optical amplifier is capable, in principle, of supporting the propagation of multiple spatial modes in its wide portions, only the single spatial mode of the light received at its input actually propagates and the amplifier maintains this mode as the light is amplified to high power levels. The amplifier allows the light to diverge as it propagates in the amplifier. By having a low current density at the input end, the injected light beam is first allowed to diverge in the amplifier before receiving strong amplification in the more heavily pumped output region of the amplifier. Hot spots near the input end, which would otherwise distort the beam and lead to optical filamentation and a spatially incoherent multimode output, are thus avoided by providing only a low level of pumping near the input end. To reduce the tendency toward filamentation, this low level pumping of the first amplifier section should extend for at least several Rayleigh ranges of the injected beam. Also, by only allowing strong amplification at the output end of the amplifier, spatial hole burning in the input region is avoided.

The optical amplifier may be a flared amplifier having a gain region that increases in width toward its output at a rate that equals or exceeds the divergence of the light propagating within the amplifier. The optical signal is amplified along the length of the flared amplifier such that peak intensity remains nearly constant and the increase in power is a result of the expanding mode width of the amplifier.

The objects of the invention are also met by a master oscillator power amplifier (MOPA) device employing such a differentially pumped amplifier. The amplifier is optically coupled to a laser oscillator, which is not necessarily monolithically integrated on the same substrate as the amplifier. In fact, the laser oscillator does not even need to be a semiconductor laser diode, but can instead be a solid-state laser or fiber laser providing light at a wavelength within the gain band of the semiconductor optical amplifier. In the case of a monolithic MOPA device, the laser oscillator can be a single mode DBR laser diode. Whatever laser source is used, if the amplifier receives a spatially coherent light beam at its input, differential pumping will enable the amplifier to maintain that coherence as the beam expands in width and is amplified within the amplifier, so that a spatially coherent high power output beam will be emitted from the device.

A single mode preamplifier may be employed between the laser oscillator and optical amplifier in order to increase the optical power of the single mode laser light that it receives from the laser oscillator to an optimum level before it is introduced into the input end of the broad output amplifier. The optical power of the amplifier's input should be sufficiently high to allow the amplifier to operate efficiently with lower charge densities at its input end, and thereby reduce the thermal dependent lensing effects that would otherwise generate and amplify incoherent optical filaments in wide portions of the amplifier. However, the optical power at the amplifier's input should also be below the power levels that cause spatial hole burning or gain saturation at the input end of the amplifier. The preamplifier could also be used to modulate the intensity of the device's output beam by modulating its pump current.

The laser oscillator and, when present, the preamplifier can have a constant mode width throughout their length. Alternatively, the preamplifier or, when the preamplifier is absent, the laser oscillator may be tapered to alter the divergence of the light provided to the amplifier. A narrowing taper combined with a larger amplifier flare can produce a faster rate of increase of optical power over the amplifier's length. Other means, such as integrated lens elements, may be provided to alter the amount of beam expansion in the amplifier.

A short input section of the amplifier may be modulated. Because of the small area of the amplifier section being modulated, the modulation power is reduced and the modulation speed is increased relative to schemes which modulate the entire amplifier. Furthermore, compared to direct modulation of a laser, modulation of the current applied to the input section of the amplifier can lead to a linearity improvement in the current-to-light intensity conversion. Such an improvement is of value in amplitude modulated vestigial sideband light-wave systems. Still further, if different frequency modulation signals are applied to the laser and amplifier or to different portions of the amplifier at the same time, then harmonics of such modulation frequencies are readily generated. These harmonic frequencies can be higher than readily generated driver frequencies, thus enabling high frequency modulation. If direct modulation of the laser oscillator is desired instead, then the laser should have a high Q cavity to avoid wavelength chirp during modulation.

BEST MODE FOR CARRYING OUT THE INVENTION

Figure 1:
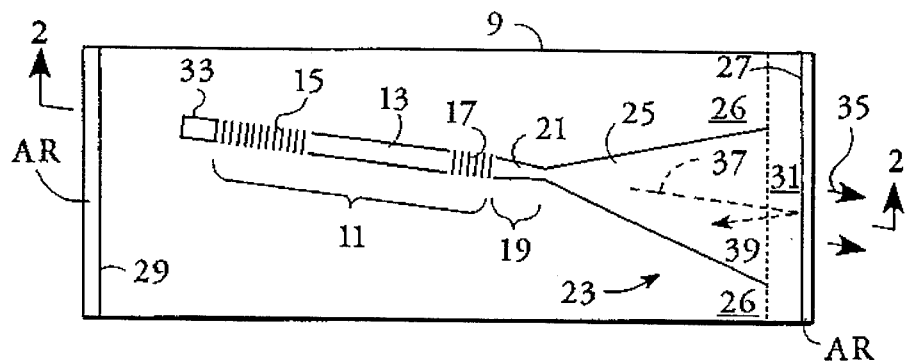
FIG. 1 is a top plan view of a MOPA device of the present invention.
Figure 2:
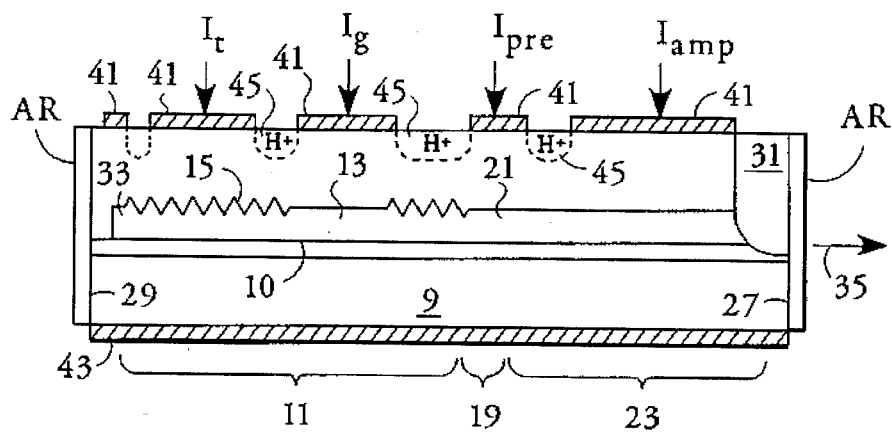
FIG. 2 is a side sectional view taken along the line 2—2 in FIG. 1.

With reference to FIGS. 1 and 2, a monolithically integrated, flared amplifier type, master oscillator power amplifier (MOPA) device of the present invention comprises a single mode diode laser oscillator 11, an optical preamplifier 19 and a flared optical power amplifier 23, all formed on a common substrate 9. The MOPA device is formed as a semiconductor material body with a plurality of contiguous semiconductor layers disposed on the substrate 9 and with electrodes 41 and 43 provided on top and bottom surfaces of the body. Typically, the material composition is some combination of group III-V compound semiconductors, such as GaAs/AlGaAs, InGaAs/AlGaAs or InP/InGaAsP. However, other direct bandgap semiconductor materials may also be used. The semiconductor material body can be formed with a homostructure, single heterostructure or, preferably, a double heterostructure or multiheterostructure. All such structures include an active light emitting region 10 near a pn junction in the body. This active region 10 may be a single active layer, a single quantum well structure or a multiple quantum well (MQW) structure. Strained-layer superlattice structures may be used. The electrodes 41 and 43 provide a forward electrical bias across the pn junction and inject electrical current $I_t$, $I_g$, $I_{pre}$ and $I_{amp}$ through the active region 10 in the various areas of the MOPA device. Thus, a pump current $I_g$ greater than a lasing threshold current density injected through the active region 10 in a gain section 13 of the laser oscillator 11 causes lightwaves to be generated in the gain section 13 and to propagate under lasing conditions. The function of the other current injections will be described later. The active region 10 and the adjacent layers above and below it form a transverse waveguide for light propagation. The term "transverse" is used here to refer to the direction perpendicular to the plane of the active region 10. Lateral waveguiding is also provided in portions of the MOPA device which are specified below. The term "lateral" refers to the direction in the plane of the active region perpendicular to the direction of propagation. The direction of laser light propagation itself is referred to as the "longitudinal" direction.

The diode laser oscillator 11 is preferably a distributed Bragg reflector (DBR) laser defined by first or second order DBR gratings 15 and 17 bounding a single mode gain section 13. Preferably, lateral real refractive index waveguiding is used to define the single mode gain section 13. The gratings 15 and 17 may be formed between two adjacent semiconductor layers with different refractive indices or at an air-semiconductor interface on a surface of the semiconductor material body. Such gratings should be sufficiently close to the active light emitting region 10 to interact with lightwaves propagating in the active region 10 and neighboring layers. The degree of optical lightwave overlap, $\Gamma_g$, with the gratings 15 and 17 partially determines the effective reflectivity of these gratings. Deeper grating teeth generally have higher reflectivity. Gratings with a greater number of teeth, such as rear DBR grating 15, also tend to have greater reflectivity than gratings with fewer teeth. Grating reflectivity further depends on the relation between the tooth spacing or grating pitch $\Lambda$ and the wavelength of the incident lightwaves. Periodic gratings have a reflection response that peaks at the wavelength that satisfies the Bragg condition $\Lambda=m\lambda_0/2\, n_{eff}$, where m is an integer representing the diffraction order, $\lambda_0$ is the free space wavelength of the lightwaves and $n_{eff}$ is the effective refractive index in the grating region. Whenever they can be fabricated, first order gratings (m=1) are preferable, because they generally have a higher reflectivity than second order gratings. Second order gratings (m=2), on the other hand, because of their larger pitch $\Lambda$, are easier to fabricate than first order gratings.

The use of a DBR laser 11 in the MOPA device of the present invention minimizes multiple residual reflections into the power amplifier 23 and enables higher operating powers for the MOPA device. (If cleaved coupled cavities were to be used instead, the residual reflections to the amplifier that would occur in the cleaved region between the master oscillator and the power amplifier would limit operation of the MOPA to low or moderate power.) The DBR laser oscillator 11 also enables the alignment of the length of the MOPA at a nonperpendicular angle to the cleaved output facet 27, as indicated by the longitudinal axis 37 of the MOPA. Such an alignment reduces reflective feedback into the master oscillator 11 and also eliminates filamentation in the power amplifier 23. Any light traveling along the longitudinal axis 37, or along a parallel path, that happens to be reflected by the antireflection (AR) coated emitting facet 27 will be directed along a new path in a different direction that is not parallel to the axis 37, as indicated by dashed line 39 in FIG. 1. Typically, an alignment in which the longitudinal axis 37 is at least 6° away from the perpendicular to the facet 27 is sufficient to minimize feedback.

In order to reduce residual reflections off of the rear facet 29 and to prevent such light from coupling back through the rear DBR grating 15 into the laser oscillator 11, the grating 15 should be made highly reflective, such as by giving it a large number of teeth, and the facet 29 antireflection (AR) coated to give it very low reflectivity. A detector 33 for power monitoring may be provided at the rear of the laser. A separate conductive surface contact and lead will provide the detector 33.

Minimal absorption in the grating regions 15 and 17 can be achieved by a change of composition of the semiconductor material, by means of impurity induced disordering (IID), etch-and-regrowth or other methods of composition change, in order to raise the effective bandgap in those regions. Alternatively, one or both of the gratings 15 and 17 can be pumped with electrical current to minimize the absorption. Such pumping also has the effect of making the grating region frequency tunable. For example, in the embodiment shown in FIGS. 1 and 2, the high reflectivity, rear DBR grating 15 of the laser oscillator 11 is electrically pumped with a tuning current $I_t$. The injection of current $I_t$ into the grating region 15 changes the effective index of refraction $n_{eff}$ in the grating region 15, and therefore, changes the wavelength of peak reflectivity of the grating 15. This changes the emission wavelength of the laser oscillator 11, allowing the laser to be frequency tunable. Typically, the laser oscillator is tunable over a wavelength range of at least 5 nm. The conductive surface contacts 41 for injecting the tuning current $I_t$, pump current $I_g$ and others may be electrically isolated from one another by isolation regions 45 formed in the surface of the semiconductor body by proton implantation or by other known means.

The output of the master oscillator 11 is coupled to a preamplifier 19 prior to being injected into the flared amplifier 23. The preamplifier 19 has a single mode waveguide 21. Alternatively, the preamplifier 19 need not be a single mode preamplifier over its entire length. The active region 10 in the waveguide 21 is electrically pumped with a current $I_{pre}$ injected through conductive contacts 41 and 43. The contact 41 for the preamplifier 19 may be electrically isolated from adjacent contacts for the laser oscillator's gain region 13 and for the flared amplifier 23 by means of proton surface implants 45 or by another known isolation structure. The single mode waveguide 21 of the preamplifier 19 can have a constant mode width, typically about 1 to 5 μm. Alternatively, the preamplifier waveguide 21 can be tapered or flared slightly to a smaller or larger width in order to increase or decrease the divergence of the beam in the flared amplifier section 23. The smaller the output of the preamplifier 19 is, the larger the divergence of the beam in the amplifier 23 will be, and the faster the flare of the amplifier 23 will need to be in order to match this increased divergence. The higher divergence beam that results from such a tapered preamplifier waveguide 21 will generally result in a higher output power over a shorter amplifier length.

The optical signal power received by the preamplifier 19 from the laser oscillator 11 is amplified (or absorbed) by the preamplifier 19 to a signal level which is optimized so as not to produce spatial hole burning in the flared amplifier. Thus, the current density in the preamplifier 19 may require separate adjustment from that of the flared amplifier 23.

Figure 5:
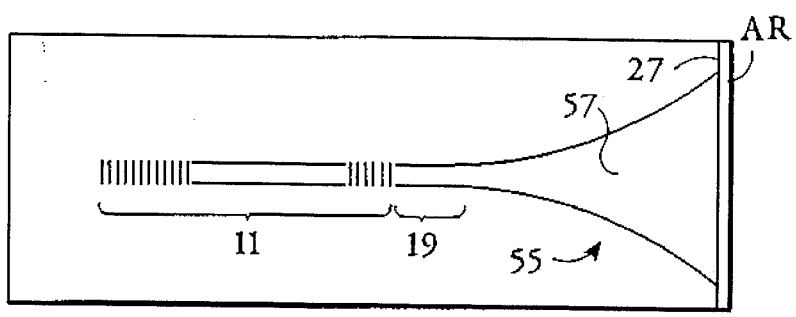
Figure 18:
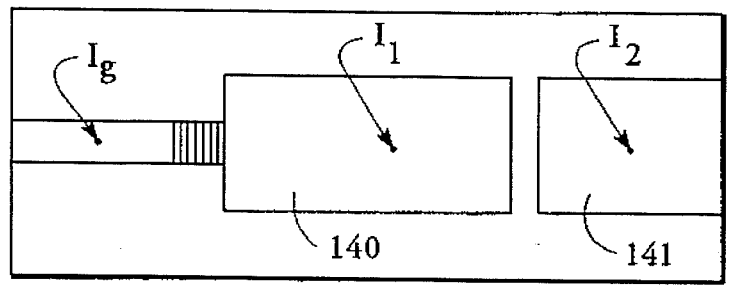
Figure 19:
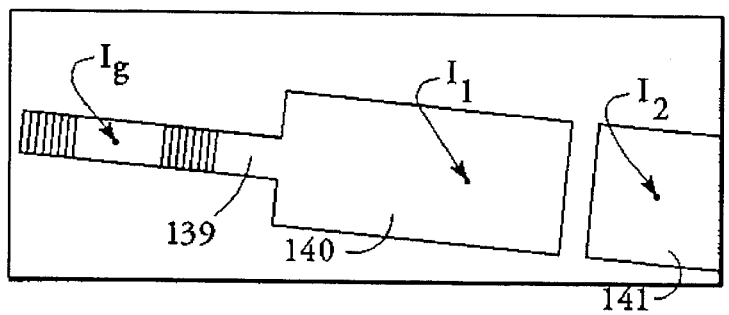

A flared power amplifier 23 is coupled to the preamplifier 19. The amplifier 23 has a transverse waveguiding region 25 with an active light emitting gain region 10 sandwiched between adjacent, higher bandgap, lower refractive index layers above and below the active region 10. The transverse waveguiding region 25 of the amplifier 23 could also be designed, by tailoring the composition and thickness of one or more of the semiconductor material layers that form the waveguide 25, to minimize the optical overlap of the propagating mode with the active region 10 in order to avoid saturation and to maximize the gain and output power, while minimizing the effects of charge and intensity dependent lensing. Such an optimization could involve making waveguide above, below, or both above and below the active region 10 to be asymmetric, thereby causing the peak intensity of the light means to not reside in the active region 10. The amplifier 23 is electrically pumped with an amplification current $I_{amp}$ through conductive contacts 41 and 43. The width of the top conductive contact 41 above the amplifier 23, and consequently the width of the gain region, is flared such that it has a first width at the input end of the amplifier 23 that substantially matches the width of the output of the preamplifier waveguide 21 and a second width at the output end of the amplifier 23 that is significantly wider than the first width. Typically, the amount of flare or increase in width in the amplifier's pumped gain region defined by the contact 41 or other lateral waveguiding means, such as from impurity induced disordering (IID), matches or is only slightly larger than the divergence of the light beam received from the preamplifier 19. The flare of the pumped gain region 25 of the amplifier 23 is typically linear, as shown in FIG. 1, but could also be parabolic, as seen in FIG. 5, or some other shape, such as the rectangular amplifier section 139–141 seen in FIGS. 18 and 19, selected to maximize the diffraction limited output power.

The areas 26 outside of the pumped gain region 25 of the flared waveguide 23 can be made to have higher loss, such as by compositional change to remove the transverse waveguiding properties of one or both of the layers sandwiching the active region layer(s) 10 or by another known means of increasing absorption or loss, in order to reduce distortions associated with edge effects of the amplifier 25. The amplifier 23 can be uniformly pumped with the amplification current $I_{amp}$ by means of a contact 41 that extends over the entire flared region 25. Alternatively, the pump pattern of the flared amplifier 23 can be tailored, as shown for example in FIG. 7, to match the intensity profile of the propagating beam, thereby reducing the intensity dependent lensing effects in the flared amplifier region 25.

Figure 8A:
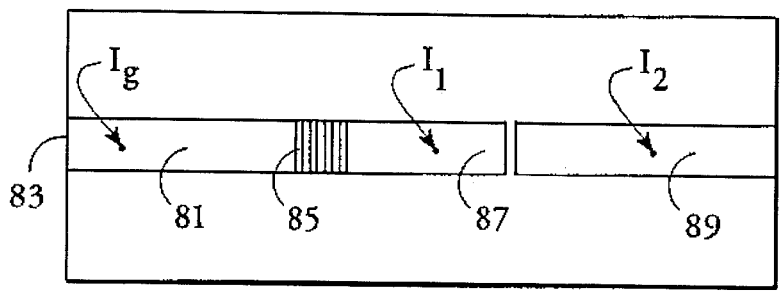
Figure 8B:
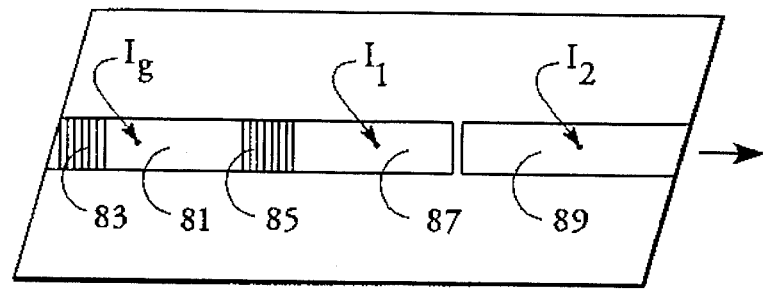

Differential pumping along the length of the amplifier can allow higher power, more efficient, more coherent operation. In the case of single mode amplifiers (which do not contain a flare or broad area amplifier), such as those seen in FIGS. 8a, 8b and 9, pumping a lower current $I_1$ on the input end 87 vs. the current $I_2$ on the output end 89 has at least two advantages.

First, if the amplifier 87 and 89 can be differentially pumped, then the amplifier output can be modulated by pumping a much smaller section 87 of the amplifier, preferably near the amplifier input end. This allows high speed modulation since a) the modulated segment 87 of the amplifier can be quite short allowing a low total modulation current $I_1$ to be used and b) modulation of the input 87 to the amplifier rather than the laser 81 itself eliminates chirping (wavelength modulation) which occurs when the laser pump current $I_g$ is modulated. Note that the amplifier is modulated by turning on and off the forward bias current $I_1$. Alternatively, a reverse biased modulator section 87 outside the laser 81, followed by another amplifier section 89 is also possible since the reverse biased modulator section 87 could be made shorter in order to achieve the same on/off extinction ratio if a lower input power were injected into the modulator 87 (that is, the following amplifier section 89 allows the input to the modulator section 87 to be of lower intensity, thereby allowing the modulator 87 to be shorter and therefore of higher speed).

Figure 9:
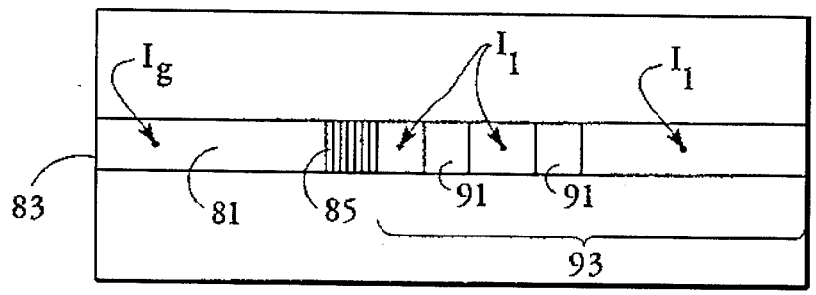

Second, if the amplifier 87 and 89 (any amplifier) is differentially pumped wherein a lower current $I_1$ is applied near the input end 87 of the amplifier versus the output end 89, then the noise caused by spontaneous emission which could be fed back into the laser source should be reduced. This can be understood by considering a noise photon that is generated either near the input end or output end of the amplifier. If a noise photon happens to be generated near the output end 89, and if the input end 87 has high gain, this photon will be highly amplified as it travels toward the laser 81. However, if the input end 87 has low gain, a lower noise amount will be injected into the laser 81. The differential pumping could be produced with electrically isolated contacts over the different sections 87 and 89, as in FIGS. 8a and 8b, or could be produced using resistive segments 91, as seen in FIG. 9. The resistive segments 91 may be insulative material or implanted material in the amplifier region 93, providing higher resistance to the flow of current $I_1$. The segments would have variable lengths or spacings so that the effective current density seen at the active gain region of the amplifier section 93 varies along its length. This technique allows contacts connected to the same potential to be used on all of the sections.

In the case of flared or broad area amplifiers, such as those shown in FIGS. 10–15, differential pumping along the longitudinal and transverse dimensions can lead to the following improvements. First, as for single mode amplifiers, high speed modulation can be obtained. Second, lower noise fed back into the laser is obtained. Third, unlike single mode amplifiers, flared or broad area amplifiers can exhibit modal distortion due to effects of both lateral and longitudinal thermal and charge distributions on the propagating amplified beam. For example, if the optical power density in the amplifier becomes too high at any point along the length of the amplifier, spatial hole burning in the gain will occur. This causes filaments to form in the amplifier, which causes phase front distortion and the lack of a good far field beam profile. Thus, it is desirable to tailor the gain along the length of the amplifier so that the beam is allowed to spread out before a high gain level is applied to the beam. Therefore, when the amplified beam can spread laterally it is also possible to achieve a higher coherent undistorted output power by pumping a greater current density near the output region than near the input region. A theoretical analysis for the three current profile cases illustrated in FIGS. 17a–c and verified by experiment shows that a uniform current density $J_0$ (FIG. 17a) in a 1500 µm long flared amplifier with 10 µm side input aperture and 160 µm wide output aperture will allow an output beam of about 300 mW cw power at 1.07 times the diffraction limit. Above that power level, distortion created at the input end of the amplifier causes the far field to broaden. However, pumping the amplifier with a differential stepped or graded current density (FIGS. 17b and 17c, respectively), where $0.3 J_0$ is the current density for the input end of the amplifier and $1.7 J_0$ is the current density for the output end of the amplifier, respectively allows up to 3.07 W and 2.66 W cw of output power to obtain a far field at 1.07 times the diffraction limit of the beam. Thus, differential pumping is highly beneficial to the creation of the high power coherent output.

Figure 10A:
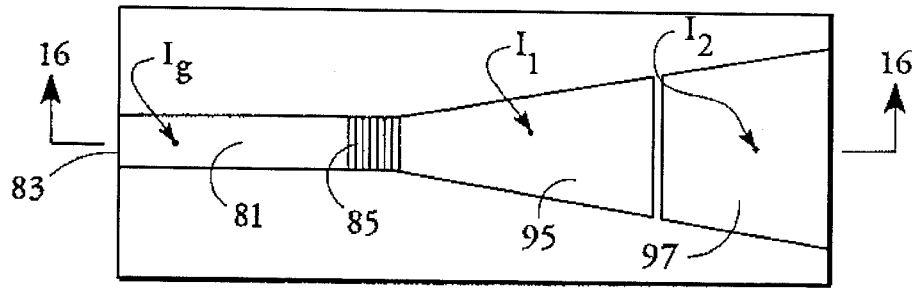
Figure 10B:
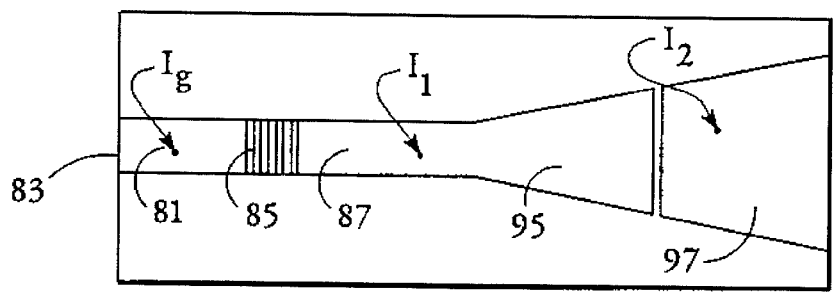

Referring to FIGS. 10a and 10b, a laser oscillator 81 with feedback grating 85 and a cleaved facet mirror surface 83 defining a laser cavity is coupled to a multimode optical amplifier, here shown as a flared amplifier, with an input end 95 and an output end 97. Separate contacts provide different currents $I_1$ and $I_2$ to the respective input and output ends 95 and 97 of the optical amplifier.

Figure 16:
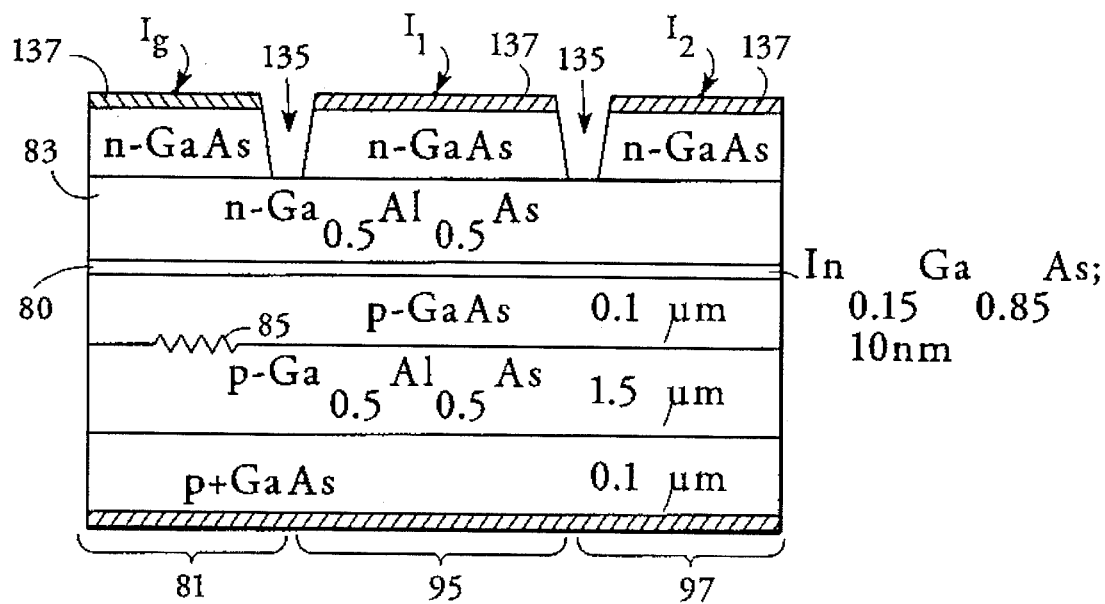
FIG. 16 is a side sectional view of the embodiment in FIG. 10, taken along the lines 16—16 in FIG. 10.

Graded pumping current distributions can be obtained by adding resistance near the amplifier input. One way to add resistance and therefore keep the current density lower is to add contacts 137 separated by slots 135 along the length, as seen in FIG. 16. FIG. 16 exhibits devices that are isolated on the n-side of the amplifier. However, isolated contacts could instead be fabricated on the p-side of the amplifier, for example, via H$^+$implantation. The etched slots 135 or other resistive regions, such as those formed by implants, keep the currents $I_g$, $I_1$ and $I_2$ separate down to the waveguiding layers so that different current densities are injected through the various local areas of the active region 80. Laterally shaped contacts can also tailor the gain to optimize the coherent output power.

Figure 11:
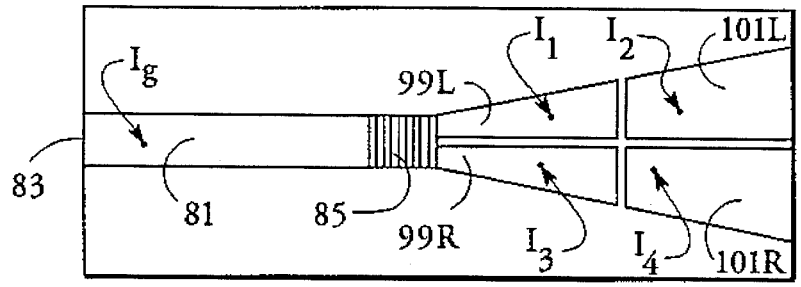

In FIG. 11, four separate contact regions 99l, 99r and 101l and 101r allow both longitudinal and lateral differential pumping of the flared optical amplifier with independent current levels $I_1$–$I_4$ provided to each region. As in FIG. 10, a lower current density for the regions 99l and 99r at the input end of the optical amplifier and a higher current density for the regions 101l and 101r for the output end of the optical amplifier produces a high power coherent light beam with reduced noise. Lateral differential pumping with a higher current density on one side 99l and 101l versus the opposite side 99r and 101r causes lateral deflection of the output beam by producing a lateral variation in refractive index in the waveguiding layers. Potentially, the number of contacts to regions 99l, 99r, 101l and 101r can be increased to further enhance beam steering or to minimize the effects of filamentation, or both.

Figure 12A:
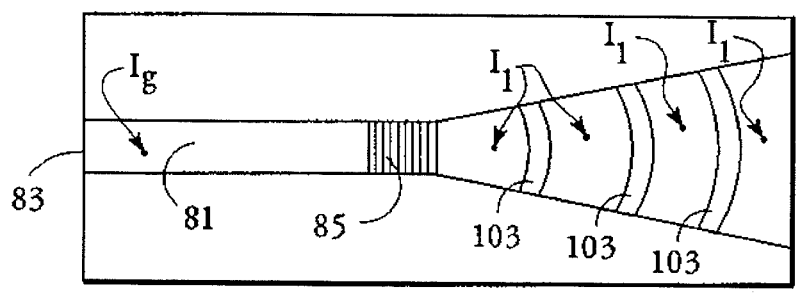
Figure 12B:
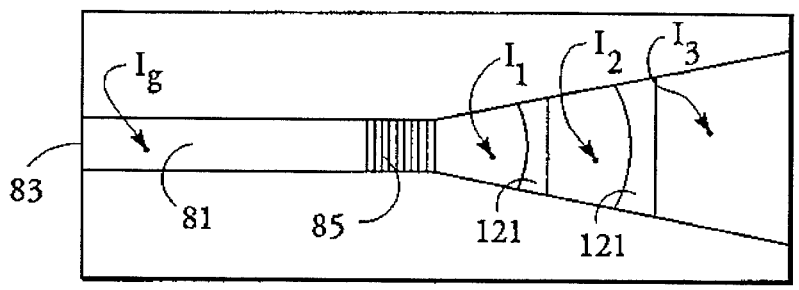
Figure 12C:
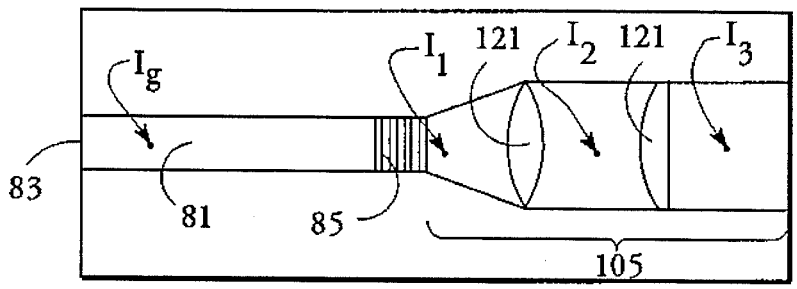

With reference to FIGS. 12a to 12c, resistive regions 103 could be formed in the flared waveguide 105 to vary the local resistance to the injected current $I_1$. Changing the size or spacing of the resistive regions 103 effectively alters the current density seen by the active gain region of the amplifier. The resistive regions can have a shape which is tailored to match the phase fronts of the light propagating in the amplifier to minimize phase distortion. Alternatively, the resistive regions would be shaped to deliberately cause focussing or defocussing, as in a lens, by altering the refractive index in selected areas. A combination of lenses causing defocussing of the light at the input end of the amplifier and focussing or collimation near the output end can further enhance high power coherent performance. Also, as in FIGS. 21–26, 30 and 31, the lateral waveguide of the amplifier can be used to refocus or collimate the amplifier beam.

Figure 13:
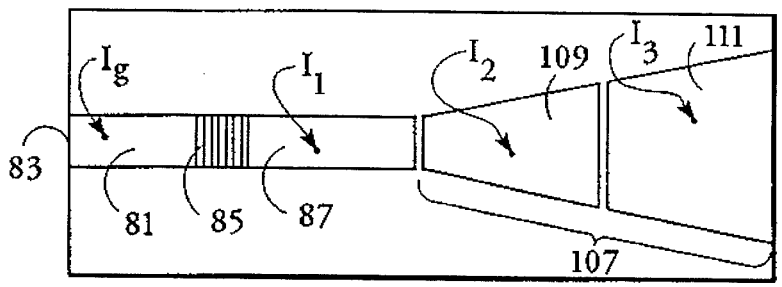

Referring to FIG. 13, the MOPA device may have a laser 81 pumped with current $I_g$, followed by a preamplifier section 87 pumped with a current $I_1$, followed by a flared amplifier 107, as in FIG. 1. The flared amplifier 107 could also be differentially pumped with a current $I_2$ at input end 109 and a current $I_3$ at output end 111. Preferably, the current density provided by injected current $I_2$ is lower than the current density provided by the injected current $I_3$. The preamplifier 87 may be pumped with a modulating current $I_1(t)$ rather than a fixed current. The modulation should be low enough to reduce noise from spontaneous emission in the flared amplifier sections 109 and 111, as well as low enough to reduce beam distortion as a result of thermal and charge distribution effects at the peak current levels. Modulating the preamplifier 87 rather than the laser 81 avoids a wavelength chirp common to most oscillators 81. The laser 81 could alternatively be a high Q laser with a grating 85 having greater than 40% reflectivity. The grating 85, tailored to have reflection at the peak $\lambda_0$ in the laser gain band, could be electrically pumped to be transparent at wavelength $\lambda_0$ while still having loss at other wavelengths in the gain band, thereby minimizing the wavelength chirp and reducing feedback noise into the laser. Then the laser 81 itself could be modulated with a modulating pump current $I_g(t)$ at very high modulation rates. The high Q laser has a low power output which is first amplified by single mode preamplifier 87 before entering the multimode flared amplifier 107.

Other types of modulation can also improve performance for certain applications. In AM modulated systems laser linearity of output power versus input current is a critical parameter. Nonlinear operation causes second and third order harmonics of the modulation signal to be generated. Use of an amplifier with at least one contact separate from the laser can be used to improve linearity. For example, the output from the MOPA can be optically detected, sensed electronically for the undesired harmonic components generated by the nonlinearity and a partial signal may be fed back into at least one of the amplifier contacts to reduce the harmonic content. Conversely, different frequency signals can be applied to the laser or one or more amplifier contacts in order to generate frequencies owing to harmonics which could not otherwise be generated by the lower speed drive electronics providing the modulation.

Figure 14:
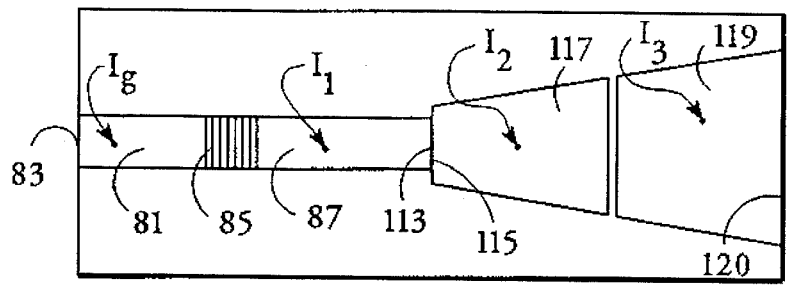

In FIG. 14, the output aperture 113 of the preamplifier section 87 does not match the mode size of the input aperture 115 of the multimode optical amplifier's input end 117. By broadening the input of the flared amplifier, the thermal gradient is reduced and the tendency to filament is also reduced. Typical dimensions for this embodiment are 1–5 µm for the width of the waveguide defining the single mode laser oscillator 81 and single mode preamplifier section 87, 30–500 µm for the length of the preamplifier section 87, 10–20 µm for the width of the input aperture 115 of the optical amplifier, 500–3000 µm for the total length of both input and output ends 117 and 115 of the optical amplifier and 160–400 µm for the width of the output aperture 120 of the optical amplifier. However, those dimensions are not absolutely critical. In the case where a 2000 µm long amplifier is pumped with a current $I_1=I_2=165$ mA (J=200 A/cm$^2$) on the preamplifier 87 and the input half 117 of the amplifier and a current $I_3=4.0$ A (J=2000 A/cm$^2$) on the output half 119 of the amplifier, where $I_g=93$ mA and the input power provided by the preamplifier 87 is about 60 mW, the output power at output aperture 120 was found to be 1.8 W of diffraction limited light (FWHM =1.02×diffraction limit =0.223°) in an experimental InGaAs MOPA device. This compares favorably with the 200–600 mW outputs provided by uniformly pumped amplifiers.

Figure 15:
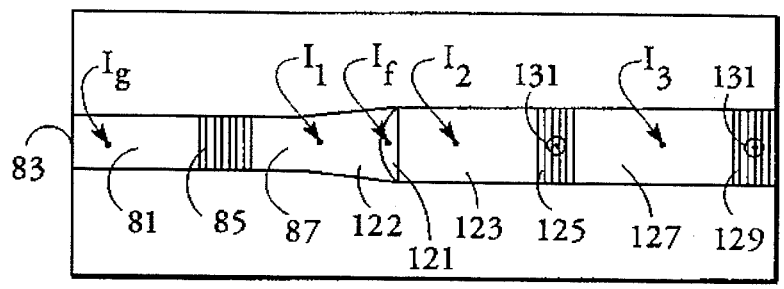

In FIG. 15, yet another embodiment includes a focusing lens 121 pumped with a focusing current $I_f$ to collimate the light received from the flared first amplifier 122. Alternatively, the index of refraction step that results in the lens 121 can be grown into the structure, for instance, via a two-step MOCVD growth process. The purpose of the lens 121 in this configuration is to collimate the light to match the subsequent broad area amplifiers. Successive amplifier sections 123 and 127 alternate with detuned surface emitting gratings 125 and 129 coupling out the light beams 131 from the amplifiers 123 and 127. Each amplifier section 122, 123 and 127 could be separately pumped with current $I_1$, $I_2$, and $I_3$, respectively. As in previous embodiments, the flared amplifier section 122 could be provided with a lower current density at its input end and in the single mode preamplifier section 87, if desired.

Figure 4:
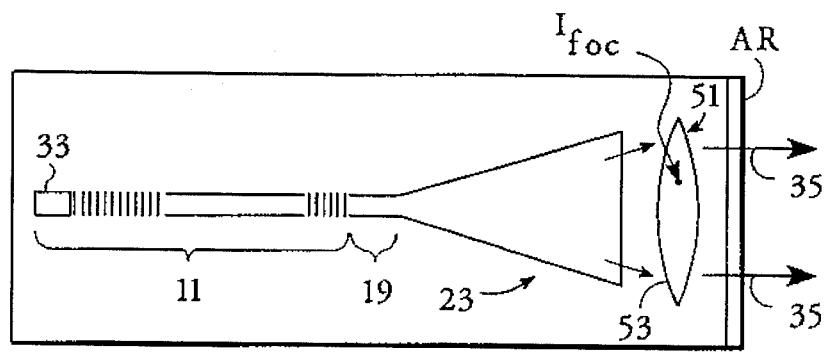
FIGS. 4–15 and 18–34 are top plan views of additional MOPA embodiments in accord with the present invention.

With reference to FIG. 4, the output of the flared amplifier 23 may be optically coupled to a monolithically integrated lens formed in the semiconductor body 9 for collimated emission. The integrated lens element 51 preferably has a separate conductive contact 53 that is electrically isolated from the flared amplifier 23. By varying the electric current $I_{foc}$ injected through the contact 53 into the lens 51, the refractive index of the lens region 51 can be varied so as to change the focal length of the lens 51. Accordingly, adjusting the current $I_{foc}$ allows the power of the lens to be matched to the divergence of the amplified light beam, so that the output 35 from the MOPA device is collimated under all operating conditions. Alternatively, the focusing power of the lens can be chosen to focus the beam to some external point, such as a single mode optical fiber.

Referring again to FIGS. 1 and 2, the region 31 at or beyond the end of the flared amplifier 23 and immediately adjacent to the output facet 27 may be a transparent window region that has been fabricated, for example, by impurity induced disordering, to have a higher bandgap than the active light emitting region 10 in order to minimize absorption loss of light passing through the window region 31. Such window regions substantially reduce catastrophic optical damage effects at the output facet 27, especially at high optical power densities, and lead to MOPA devices with longer operating lifetimes.

Figure 3:
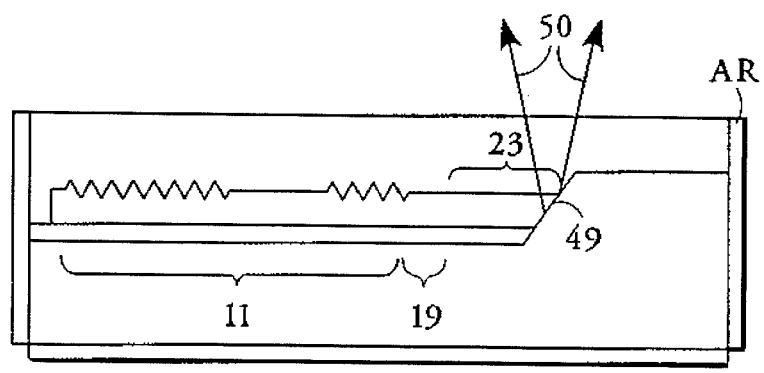
FIG. 3 is a side sectional view corresponding to that of FIG. 2 of an alternate MOPA embodiment of the present invention.

As previously described, the longitudinal axis 37 of the MOPA device can be at a nonperpendicular angle relative to the output facet 27 so that any reflection of the amplified beam off of the output facet 27 does not couple back into or otherwise interact with the laser oscillator 11. This reduction in feedback stabilizes the spectral and spatial mode of the output from the laser oscillator 11. The nonperpendicular relative orientation between facet 27 and axis 37 also eliminates optical filamentation and increases the self-oscillation threshold in the power amplifier 23. The output surface of the MOPA device can also be oriented so as to deviate transversely, rather than laterally, from an orientation perpendicular to the direction of propagation of the amplified beam. Referring to FIG. 3, the output of the flared amplifier 23 is reflected transversely toward a top or bottom surface of the MOPA device by a 45 degree mirror 49 defined in the semiconductor body by ion milling, etch-and-regrowth, or another known technique. The reflected light 50 is emitted through the MOPA surface. Because the light diverges outside of the transverse waveguide of the amplifier 23, any light that is reflected back toward the mirror 49 will have a very low probability of being coupled back into the amplifier 23. In yet another embodiment, the light could be coupled out of the MOPA device by a detuned surface emitting grating, as seen for example in FIG. 15. Active grating amplifiers, where a detuned grating is integral with the amplifier for simultaneous gain and surface emission, could also be placed after the flared amplifier. Each of these approaches could be used with the integrated lens embodiment shown in FIG. 4.

With reference to FIG. 5, a MOPA device with a laser oscillator 11 optically coupled through a preamplifier 19 to an optical power amplifier 55 is characterized by the amplifier 55 having a conductive surface contact 57 defining a gain region that is parabolically flared. That is, the width of the contact 57 and corresponding gain region increases along its length from a first width substantially matching the width of said preamplifier 19 to a substantially larger second width at the light output facet 27, where the width corresponds to the square of the distance from the preamplifier 19, the edges of the amplifier gain region thereby describing parabolae.

Figure 6:
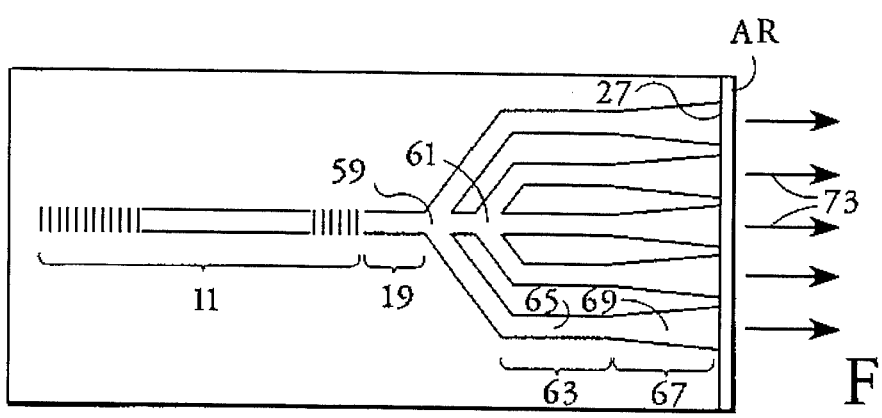

With reference to FIG. 6, the output of the laser oscillator 11 is coupled to a first preamplifier section 19 that branches at points 59 and 61 into multiple second preamplifier sections 63, each comprising a single mode waveguide 65 with conductive contacts over the waveguides 65 for optically pumping the preamplifier sections 63. An array of flared optical amplifiers 67 optically couple to the respective outputs of the preamplifier waveguides 65. The width of each amplifier gain region 69 in the array 67 matches at an input end the width of the preamplifier waveguides 65 and increases with the light divergence toward the output facet 27. Preferably, the gain regions 69 are sufficiently wide at the facet 27 to completely fill or nearly completely fill the entire width of the facet 27 with the emitted light 73 with little or no dark space between the adjacent light beam array elements. The facet 27 is preferably set at a nonperpendicular angle to the direction of light propagation in the amplifier array 67. In this fashion, it is possible to inject several flared amplifiers with a single laser oscillator, resulting in high power coherent output. In addition, the branching waveguides can be designed to have equal optical path lengths in order to produce equal phase at the output facets.

Figure 7:
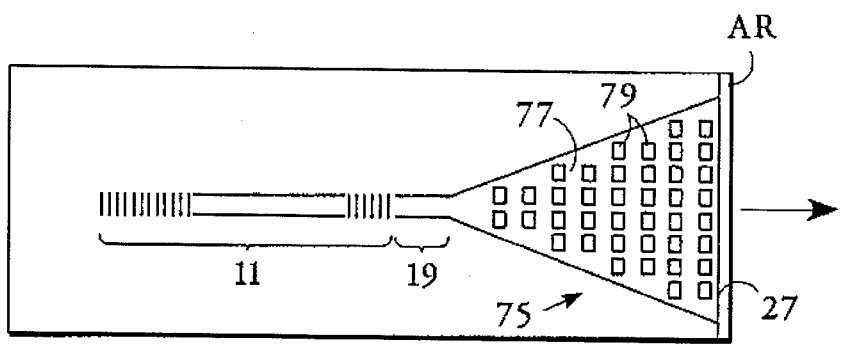

In FIG. 7, a single mode laser oscillator 11 is coupled via a single mode optical preamplifier 19 to a flared optical power amplifier 75. The amplifier 75 has a flared waveguide region 77 that expands in width with the divergence of light received from the preamplifier 19 and conductive contacts 79 that electrically pump the flared waveguide region 77. However, instead of a single unitary contact like the contact 41 for the flared waveguide 25 in FIGS. 1 and 2, the contacts 79 are multiple contacts which are electrically isolated from one another so as to be individually addressable. This allows the waveguide region 77 to be pumped with current densities that can be tailored to obtain a selected output profile. It also allows adjustments to be made in the amplifier pump pattern to compensate for varying operating conditions over time. Although it has been described as generally more desirable to have a lower current density at the amplifier's input end, there may be applications where a higher current density on the input side than on the output side is most beneficial.

The MOPA devices of the present invention may be mounted on a heat sink composed of a lower thermal resistance material, such as a diamond or a diamond film. Bonding the MOPA device to an efficient heat sink reduces thermal lensing effects in the flared power amplifier. Further, the heat sink mount can be patterned to match the expected pattern of heat generation by the MOPA device, thereby reducing any thermal gradients within the device.

Referring now to FIGS. 20–24 and 27–34, means are provided within the laser itself for altering the divergence of the light beam entering the multimode amplifier without the use of a preamplifier section. By increasing the beam divergence or by spreading out the beam prior to its reaching the multimode amplifier, spatial hole burning is decreased. Spatial hole burning is a phenomenon whereby an intense laser beam saturates the gain, causing an increase in charge density on either side of the beam and leading to filament formation and beam distortion.

Figure 20:
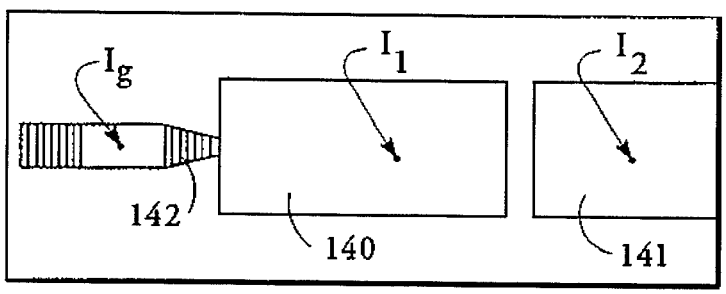
Figure 21:
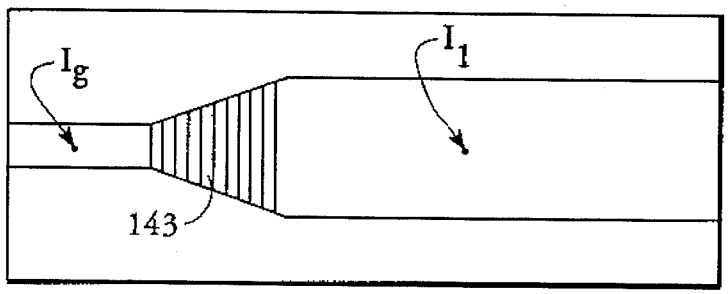
Figure 27:
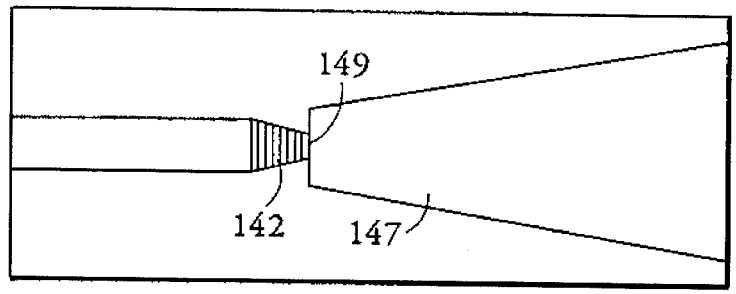

In FIG. 20, the decrease in lateral waveguide width at the output grating end 142 of the laser cavity causes the beam to diverge more rapidly as it leaves the laser. A tapered amplifier section could also be used. Current $I_1$ and $I_2$ applied to the amplifier sections 140 and 141 may be identical or differ. In FIG. 27, a tapered feedback grating section 142 produces a reduced aperture 149 at the laser output and causes a more rapid lateral beam spread in the flared amplifier 147. In FIG. 21, an increase in width of the laser's lateral waveguide at the output grating end 143 of the laser oscillator allows the beam to spread before it enters the amplifier. This improves high power coherent operation.

Figure 22:
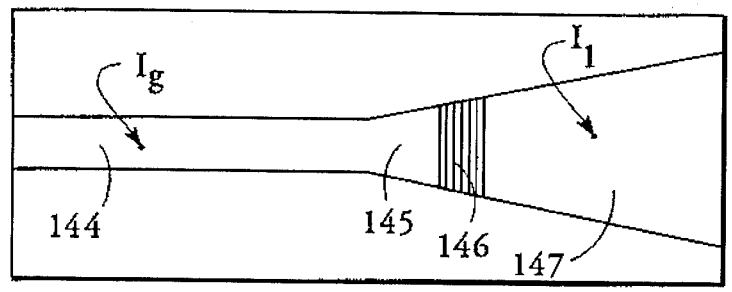
Figure 23:
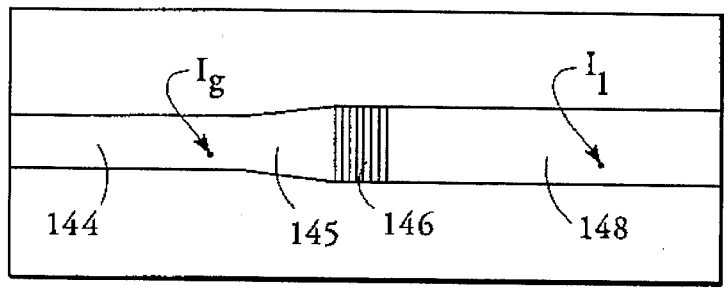
Figure 24:
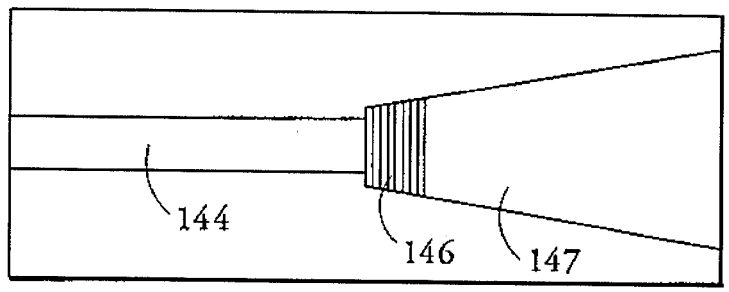
Figure 25:
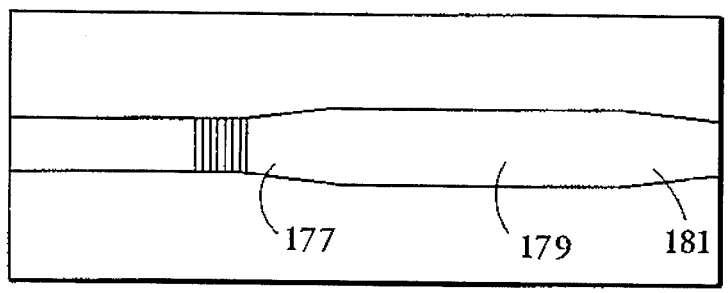

In FIGS. 22–24, the feedback grating 146 is located in an already expanded waveguide section. In FIGS. 22 and 23, the lateral waveguide 144 of the laser oscillator expands in region 145 before reaching the feedback grating 146. In FIG. 25, the waveguide width abruptly widens at the beginning of the grating 146. The amplifier to which the expanded beam couples could be a flared amplifier 147 or a broad area, rectangular waveguide, amplifier 148.

Figure 28:
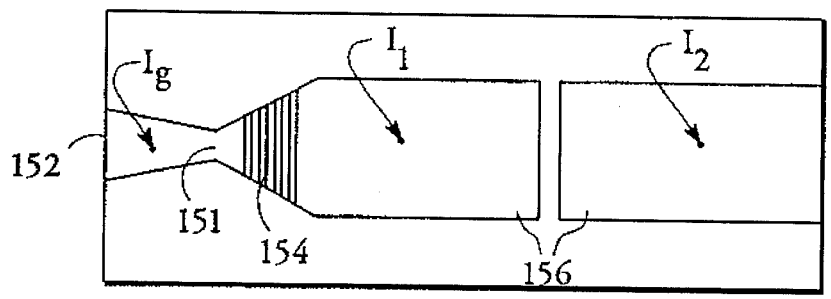
Figure 29:
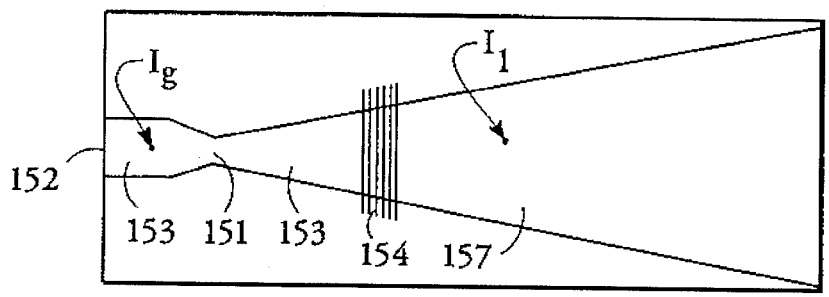
Figure 30:
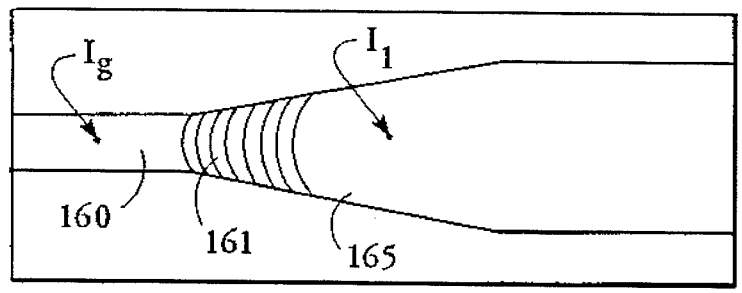

In FIGS. 28 and 29, a narrow region 151 in the lateral waveguide 153 of the laser oscillator defined by reflectors 152 and 154 causes the laser beam to spread more rapidly in the amplifier 156 or 157. This reduces the spatial hole burning which could be caused in the amplifier 156 or 157 by a localized laser beam that is too intense at the input to the amplifier 156 or 157. Typical width values for the lateral waveguide 153 of the laser range from 2 to 6 μm with a narrow region 151 of at most one micrometer width. Amplifier 156 is a broad area, straight or rectangular waveguide, amplifier, while amplifier 157 is a flared waveguide. Of course, any of these geometries could employ an amplifier with differential pumping by two or more applied currents $I_1$ and $I_2$. Alternatively, uniform pumping of the amplifier with a single current $I_1$ could also be used.

Figure 31:
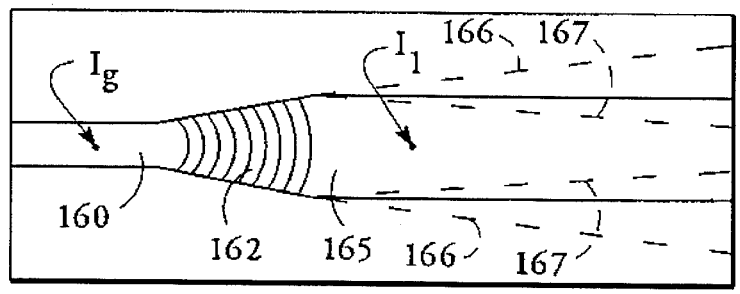
Figure 32:
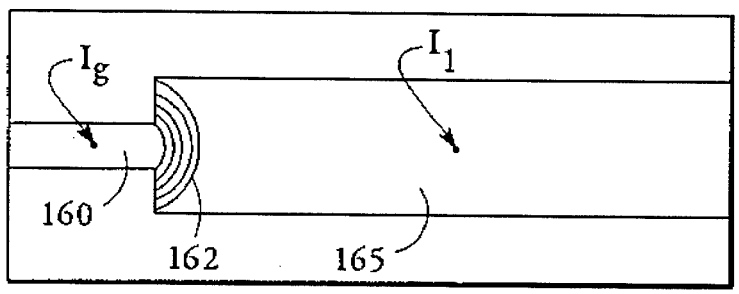
Figure 33:
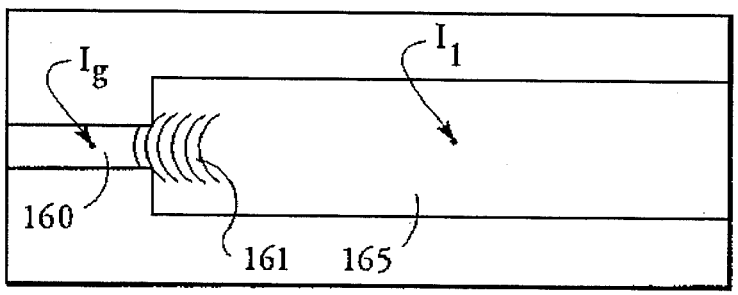

In FIGS. 30–33, the lasers 160 have a curved feedback grating 161 or 162. The curved gratings allow the laser beam to diverge upon entering the amplifier 165. The grating curvature can be chosen so that the tooth spacing and beam divergence match the mode in order to allow coherent feedback at the edges of the laser beam in the stable resonator cases shown in FIGS. 31 and 32. However, in the stable resonator, if the beam divergence and tooth curvature do not match, there may be multiple laser wavelengths emitted in different output directions. Depending on the application, this could be either desirable or undesirable. The unstable resonator cases shown in FIGS. 30 and 33 will only get feedback into the laser 160 from the central nondiverging light rays. However, in any unstable resonator, the beam will spread rapidly upon leaving the laser. This is desirable, because it reduces spatial hole burning in the amplifier 165. As seen in FIG. 31, the amplifier could be a straight amplifier as shown, or a flared amplifier indicated by dashed lines 166, or a tapered amplifier indicated by dashed lines 167.

Figure 34:
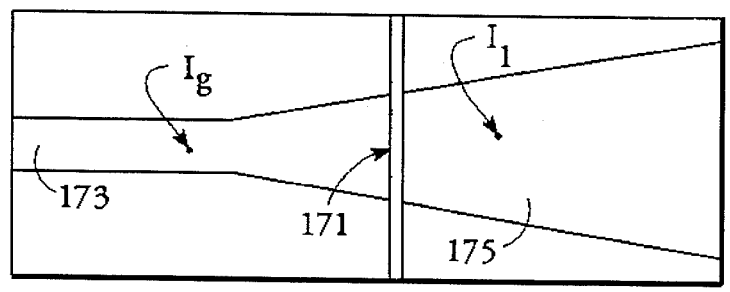

In FIG. 34, a microcleave 171 could be used to provide feedback to a laser oscillator with a flared waveguide 173. The laser could then be coupled to a flared amplifier 175. The microcleave 171 could be positioned in the flare, as shown, or in the parallel region of 173.

Figure 26:
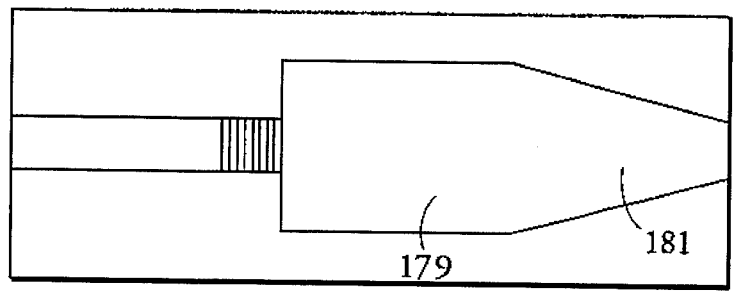

FIGS. 25 and 26 illustrate that the amplifier could have a tapered output section 181 to laterally reconverge the light beam after amplification. This provides a collimated beam in the far field by reducing the lateral phase curvature of the beam. The tapered amplifier section 181 takes the place of a lens. In FIG. 25, the amplifier first flares to an increased width in an input section 177, becomes a straight waveguide in central section 179 and then reconverges in output section 181. In FIG. 26, the flared input section 177 is absent, illustrating that the input end of the amplifier can be wider than the output end.

Figure 35A:
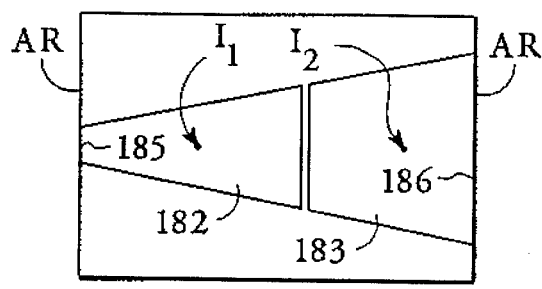
FIGS. 35a–35h are top plan views of amplifier chip embodiments of the present invention.

With reference to FIGS. 35a–h, the differential pumping which is characteristic of the present invention may also be applied to an optical amplifier semiconductor device or amplifier chip which has not been integrated with a laser oscillator. Such an amplifier chip can be optically coupled to an external laser source, as in the embodiments seen in FIGS. 36–38. In FIG. 35a, the amplifier chip includes a flared gain region which is divided into two separate pump sections 182 and 183. The pump sections may be defined by separate conductive contacts or by resistive regions within the semiconductor structure of the amplifier chip. The light received by the amplifier chip at its input end 185 is allowed to diverge as it propagates toward the output end 186, where it is emitted as a broad beam. The flared gain region defined by pumped sections 182 and 183 expands in width at a rate which equals or exceeds the divergence of the light, the light being either laterally unguided or gain guided. A multilayer waveguide encompassing the active gain region in the semiconductor chip provides vertical transverse waveguiding but generally does not provide any lateral waveguiding of the light. Any real refractive index structures that may be present at or near the edges of the flared gain region 182 and 183 is normally placed sufficiently away from the edges of the diverging light beam to avoid having any lateral waveguiding effect, and is either incidental to the operation of the amplifier or is provided for current confinement or some other purpose besides index guiding. As in the similar MOPA structure of FIG. 10a, the two pump sections 182 and 183 are independently supplied with current $I_1$ and $I_2$. Preferably, the current density in the first pumped section 182 is much less than the current density in the wider second pumped section 183 to avoid gain saturation, spatial hole burning, lensing effects, filament formation and other adverse optical effects that would lead to loss of coherence of the received light as it is amplified.

Figure 35B:
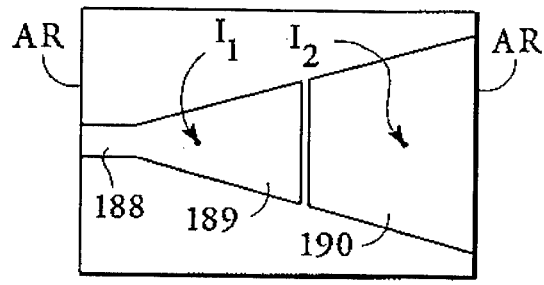
Figure 35C:
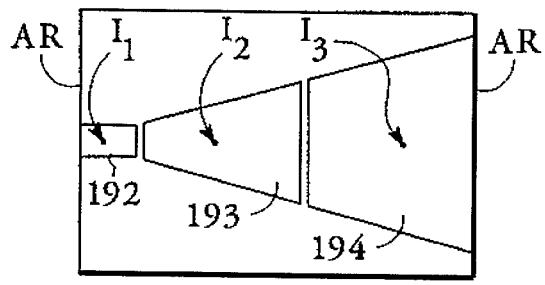
Figure 35D:
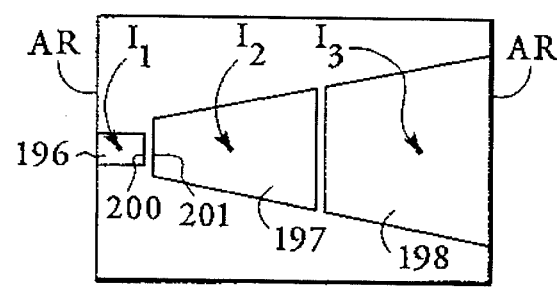

FIGS. 35b–35d show that a single mode preamplifier section 188, 192 or 196 may be provided at the narrower input end of the flared gain region. The single mode section may be gain guided, but is preferably index guided. In FIG. 35b, the preamplifier section 188 and the first portion 189 of the flared gain region are supplied with a first current $I_1$, while the wider second or output portion 190 of the flared gain region is provided with a second current $I_2$. In FIG. 35c each of the three sections 192, 193 and 194 are independently pumped with currents $I_1$, $I_2$ and $I_3$. Thus, the preamplifier section 192 may receive a different current $I_1$, than either flared pump portion 193 or 194 to optimize the optical power coupled into the first portion 193 of the flared region. While the output of the single mode preamplifier section 192 and the input of the first flared portion 193 have the same width in FIG. 35c FIG. 35d shows that the input end 201 of the first flared portion 197 may be wider than the output end 200 of the preamplifier section 196 to provide the injected light a chance to diverge freely without substantial edge effects. The amplifier chips in FIGS. 35b–35d are generally comparable to the MOPA devices seen in FIGS. 10b, 13 and 14 and already described.

In FIG. 35a, it is seen that the differential pumping of the active gain region of the amplifier chip can be different both longitudinally and laterally. A first pumped portion of the gain region has left and right halves 203L and 203R which are independently supplied with current $I_1$ and $I_3$. Likewise, the second pumped portion or output portion of the gain region also has left and right halves 205L and 205R which are independently supplied with current density $I_2$ and $I_4$. As explained for the similar MOPA embodiment in FIG. 11, lateral differential pumping allows the output direction of the amplified beam to be steered by producing a lateral variation in refractive index that deflects the beam to one side or the other by an amount that depends on the difference in left and right current densities in the gain region.

Figure 35E:
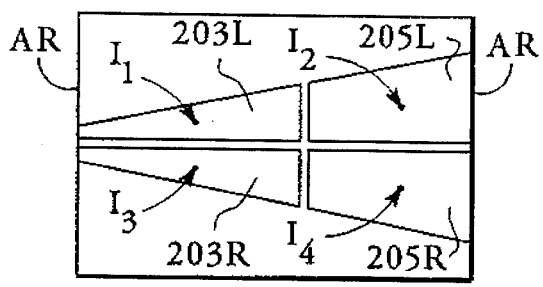
Figure 35F:
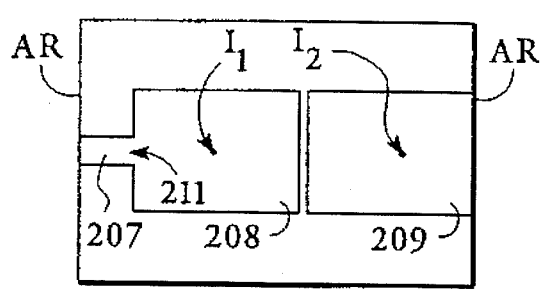

In FIG. 35*f* a single mode preamplifier section 207 is optically coupled to a rectangular broad area amplifier section having two pumped sections 208 and 209 for differential pumping. The output 211 of the preamplifier section 207 is narrower than the width of the first portion 208 of the broad area rectangular region 208 and 209. The two portions of the amplifier 208 and 209 are independently pumped with current $I_1$ and $I_2$. The preamplifier section 207 may receive the same current $I_1$ as the first amplifier portion 208, as shown, or may be independently pumped, as in FIG. 35*d*.

Figure 35G:
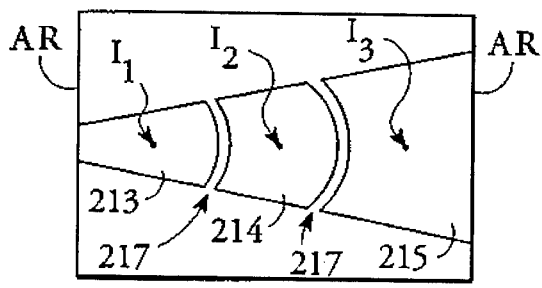

FIG. 35*g* shows an amplifier chip comparable to FIG. 12*a* having a pumped flared gain region with three pump sections 213–215 independently supplied with current $I_1$, $I_2$ and $I_3$. The contacts or resistive regions defining the separate pump sections 213–215 may be shaped so that their boundary spaces 217 match the phase fronts of the diverging light propagating in the flared region.

Figure 35H:
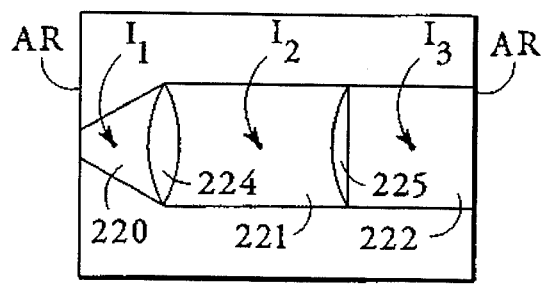

FIG. 35*h*, the shapes of the conductive contacts or of resistive regions within the amplifier chip's structure have been deliberately formed to define lenses 224 and 225 between independently pumped gain regions 220, 221 and 222. Alternatively, the lenses may be formed with real refractive index structures in the amplifier chip. The lenses 224 and 225 alter the divergence of light propagating in the pumped gain regions 220–222, causing focussing or collimation of the light, or even defocussing or increased divergence of the light.

Figure 36:
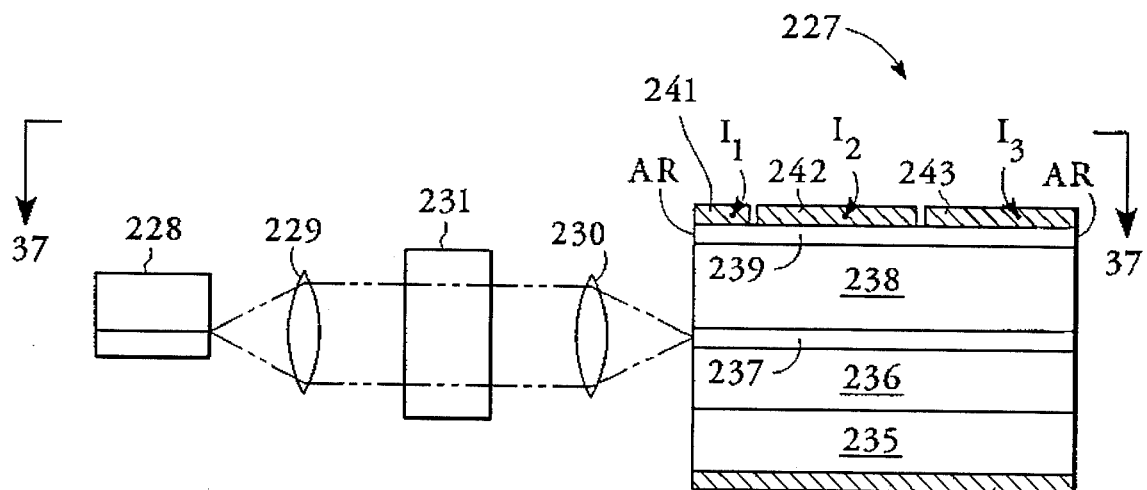
FIGS. 36 and 37 are respective sectional and top plan views of an optical amplifier of the present invention coupled to an external laser diode. The sectional view in FIG. 36 is taken along the line 36—36 in FIG. 37.
Figure 37:
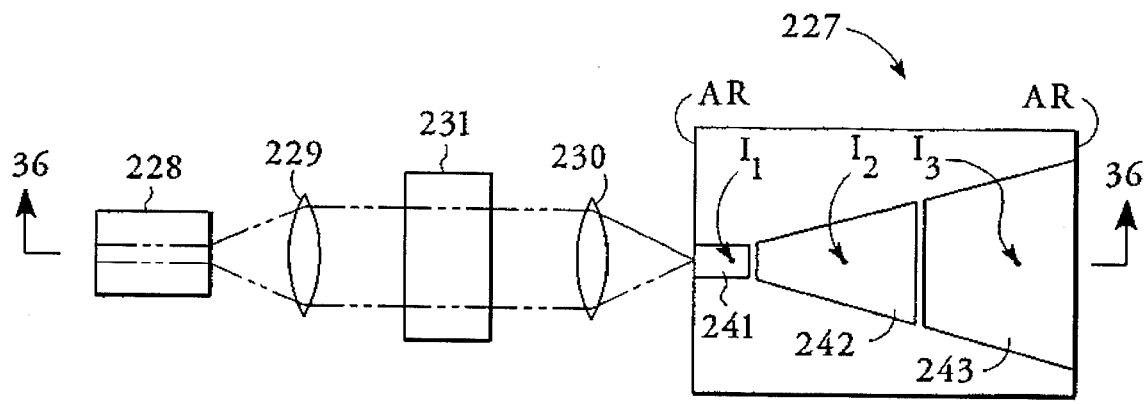

With reference to FIGS. 36 and 37, the amplifier chips in FIGS. 35*a–h* are optically coupled to a coherent light source which is external to the chip 227. Here, the coherent light source is a laser diode 228. Collimating and focussing optics, such as lenses 229 and 230, are typically provided to improve coupling of the laser light into the gain region 237 of the amplifier chip 227. An optical isolator 231, typically a Faraday rotator, may be provided in the optical path between the laser diode 228 and amplifier chip 227 to reduce back reflection into the laser 228. The laser diode 228 may be mode locked or frequency tuned, if desired.

The amplifier chip 227 consists of a multilayer semiconductor structure including an active gain region 237 and a waveguide (cladding layers 236 and 238) encompassing the active gain region 237. These and other layers 236–239 are disposed on a substrate 235 with conductive contacts 240–243 on the bottom surface of the substrate 235 and the top surface of the cap layer 239 for injecting current into the structure to excite the active gain region 237. As seen in the top plan in FIG. 37, the amplifier chip used in this example corresponds to that shown in FIG. 35*c*. However, any of the other differentially pumped amplifier devices in FIGS. 35*a–h* could also be used.

Figure 38:
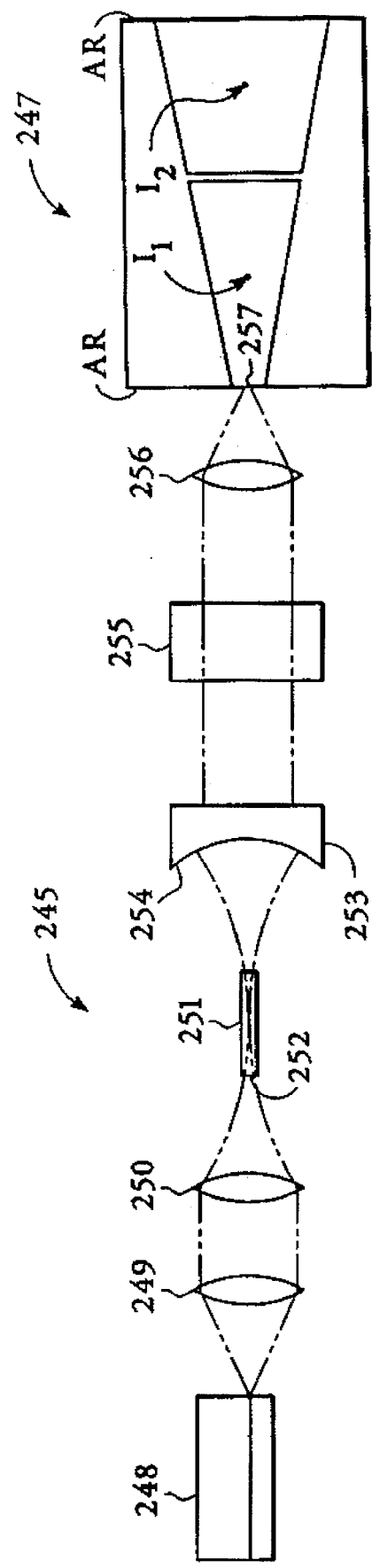
FIG. 38 is a top plan view of an optical amplifier of the present invention coupled to a laser-diode-pumped solid-state laser.

FIG. 38 shows that the amplifier chip 247 may be pumped by a solid-state laser 245. For example, a neodymium solid-state laser 245 emitting at 1.06 μm may be used with an amplifier 247 that has a strained InGaAs active gain region with a gain band that peaks around 1.06 μm. The laser 245 may be pumped with a laser diode 248 emitting 810 nm pump light which is coupled into a neodymium doped solid-state laser rod 251 via coupling optics 249 and 250. The rod 251 has its input end 252 coated for low reflectivity at the pump wavelength, i.e. 810 nm, and high reflectivity of the solid-state laser wavelength, i.e. 1.06 μm. The other cavity mirror for the laser 245 may be a reflective concave surface 254 on a glass lens base 253 so that the laser output is approximately collimated. An optical isolator 255, such as a Faraday rotator, reduces feedback into the laser 245 from the amplifier chip 247. A focussing lens 256 may be used to couple the laser light into the input section 257 of the amplifier chip. The solid-state laser may be pulsed or mode-locked, if desired.

In any of these embodiments seen in FIGS. 35*a–h* and 36–38, the input portion of the amplifier or the preamplifier section, if present, or both may be electrically modulated to allow modulation of the light at high speed. This is of particular advantage in the solid-state laser embodiment in FIG. 38, since high speed modulation is not easily obtained from solid-state lasers. Thus, the amplifier chip could be used to provide modulated amplification of the laser light. Separate contacts for the differential pumping of the amplifier allows only the input portion to be modulated, instead of the entire amplifier gain region, so that smaller modulation currents are needed and higher modulation frequencies are possible.

We claim:

1. An optical multilayer semiconductor device comprising an active gain region, including a region allowing divergence of light propagating along its length, and means for differentially exciting said light diverging region.

2. The device of claim 1 wherein said light diverging region is pumped to a lesser extent by said differential excitation means in portions of said diverging region where said light propagating therein has a lesser width than in other portions of said diverging region where said light has a greater width.

3. The device of claim 2 wherein said differential excitation means includes electrical means for applying a smaller current density to said light diverging region in said portion of lesser light width than in said portion of greater light width.

4. The device of claim 3 wherein said smaller current density applied in said portion of lesser light width is substantially zero.

5. The device of claim 2 wherein said electrical contact means applies a reverse bias to said light diverging region in said portion of lesser light width.

6. The device of claim 1 wherein said differential excitation means varies relative to a primary longitudinal direction of light propagation in said light diverging region.

7. The device of claim 1 wherein said differential excitation varies both longitudinally and laterally relative to a primary direction of light propagation in said light diverging region.

8. The device of claim 1 wherein said differential excitation means includes resistive regions in said multilayer semiconductor structure spaced apart along said light diverging region with a resistive variation at least along a longitudinal direction of light propagation.

9. The device of claim 1 wherein said light diverging region is flared over at least a portion of its length.

10. The device of claim 2 wherein said light diverging region is flared over at least a portion of its length.

11. The device of claim 10 wherein said active gain region includes a single mode section optically coupled to an input end of the flared section.

12. The device of claim 11 wherein said single mode section is index guided.

13. The device of claim 11 wherein said input end of said flared section is wider than an output of said single mode section.

14. The device of claim 10 wherein a first narrower portion and a second wider portion of said flared region are independently pumped, said first portion of said flared region being pumped to a lesser degree than said wider second portion of said flared region.

15. The device of claim 9 wherein said differential excitation means includes means for modulating at least a portion of said flared region.

16. The device of claim 11 including means for modulating said single mode section.

17. The device of claim 1 wherein said differential excitation means includes first means for modulating a single mode section and second means for modulating at least a portion of said light diverging region, said first and second means operating at different modulation frequencies.

18. The device of claim 1 wherein said active gain region includes a single mode section optically coupled to an input end of a light diverging section, said input end of said light diverging section being wider than an output of said single mode section.

19. The device of claim 18 wherein said light diverging section is a broad area section and a first portion of said broad area section is pumped to a lesser degree by said differential excitation means than a second portion of said broad area section.

20. The device of claim 19 wherein at least one of said single mode section and said first portion of said broad area section is modulated.

21. The device of claim 1 including means for altering divergence of light propagating within the device.

22. The device of claim 21 wherein said divergence altering means comprises at least one lens element.

23. The device of claim 22 wherein said lens element is induced by current selectively injected into a lens shaped region.

24. The device of claim 1 wherein said active gain region is at least partially located within a resonant optical cavity to form a laser oscillator which is monolithically integrated into said multilayer semiconductor structure.

25. The device of claim 1 wherein said active gain region is optically coupled to a laser oscillator located apart from said multilayer semiconductor structure, said device being capable of amplifying light received from said laser oscillator.

26. The device of claim 25 wherein said laser oscillator is a DBR laser diode.

27. The device of claim 25 wherein said laser oscillator is a semiconductor laser.

28. The device of claim 25 wherein said laser oscillator is a solid state laser.

29. The device of claim 25 wherein said laser oscillator is a fiber laser.

30. The device of claim 25 wherein said laser oscillator is modulated.

31. The device of claim 25 wherein said laser oscillator is mode locked.

32. The device of claim 25 wherein said laser oscillator is wavelength tunable.

33. A master oscillator power amplifier (MOPA) semiconductor device comprising
   a laser oscillator,
   an optical amplifier optically coupled to said laser oscillator, and
   means for differentially exciting said optical amplifier at least along a direction of light propagation within said optical amplifier, wherein said means for differentially exciting said optical amplifier applies a greater current density to an output end of said optical amplifier distal from said laser oscillator than it applies to an input end of said optical amplifier proximate to said laser oscillator.

34. The MOPA device of claim 33 wherein said optical amplifier has an expanding cross-section along the direction of light propagation in at least one dimension transverse to said direction of light propagation.

35. The MOPA device of claim 34 wherein said laser oscillator is optically coupled to the narrowest cross-section of said optical amplifier.

36. The MOPA device of claim 33 wherein said optical amplifier is differentially excitable both along the direction of light propagation and laterally across said amplifier.

37. The MOPA device of claim 33 wherein said laser oscillator is a single transverse mode laser.

38. The MOPA device of claim 33 wherein said means for differentially exciting said optical amplifier includes at least two conductive contacts for electrically exciting said optical amplifier.

39. The MOPA device of claim 33 wherein said laser oscillator is excited electrically.

40. The MOPA device of claim 33 wherein said laser oscillator has a strained layer semiconductor gain region.

41. The MOPA device of claim 33 wherein said laser oscillator is a single transverse mode semiconductor laser and said optical amplifier is a single transverse mode semiconductor amplifier.

42. The MOPA device of claim 33 wherein at least two electrical contacts are attached to said laser oscillator and said optical amplifier and different frequency electrical signals are applied to at least one of said contacts.

43. The MOPA device of claim 33 wherein said means for differentially exciting said optical amplifier applies a reverse bias to an input end of said optical amplifier proximate to said laser oscillator.

44. The MOPA device of claim 33 wherein said laser oscillator and said optical amplifier are monolithically integrated on a common semiconductor substrate.

45. The MOPA device of claim 33 wherein said laser oscillator includes at least one optical feedback grating.

46. The MOPA device of claim 33 further comprising a detuned grating optically coupled to an output end of said optical amplifier distal from said laser oscillator.

47. The MOPA device of claim 33 wherein said means for differentially exciting said optical amplifier includes resistive regions formed in said optical amplifier, said resistive regions being spaced apart at least along the direction of light propagation within said optical amplifier.

48. The MOPA device of claim 47 wherein said resistive regions are spaced apart both along the direction of light propagation and in a lateral direction transverse to said direction of light propagation.

49. The MOPA device of claim 33 wherein said differentially excited optical amplifier includes a single mode preamplifier section and a flared amplifier section optically coupled to said preamplifier section.

50. The MOPA device of claim 49 wherein said means for differentially exciting said optical amplifier modulates said single mode preamplifier section of said optical amplifier.

51. The MOPA device of claim 49 wherein said means for differentially exciting said optical amplifier applies a greater current density to an output end of said flared amplifier section of said optical amplifier distal from said preamplifier section than it applies to an input end of said flared amplifier section proximate to said preamplifier section.

52. The MOPA device of claim 49 wherein said means for differentially exciting said optical amplifier applies a greater current density to said flared amplifier section of said optical amplifier than it applies to said preamplifier section of said optical amplifier.

53. The MOPA device of claim 33 wherein said means for differentially exciting said optical amplifier leaves an input end of said optical amplifier proximate to said laser oscillator unbiased and applies a bias to an output end of said optical amplifier distal to said laser oscillator.

54. The MOPA device of claim 33 further comprising means for modulating current injection into said laser oscillator.

55. The MOPA device of claim 33 further comprising means for modulating current injection into said input end of said optical amplifier.

56. A monolithic semiconductor master oscillator power amplifier (MOPA) device comprising a laser oscillator formed on a substrate, and an optical power amplifier formed on said substrate and optically coupled to said laser oscillator, said amplifier having a width at an input end thereof proximate to said laser oscillator which is greater than a width of an output end of said laser oscillator.

57. The MOPA device of claim 56 wherein said amplifier is flared with a width at an output end thereof distal from said laser oscillator which is greater than said width at said input end thereof.

58. The MOPA device of claim 56 wherein said amplifier has means for applying a greater current density to said output end of said amplifier than to said input end of said amplifier.

59. The MOPA device of claim 56 further comprising an optical preamplifier section formed on said substrate with an input end optically coupled to said output end of said laser oscillator and an output end optically coupled to said input end of said amplifier, said width of said input end of said amplifier being greater than a width of said output end of said preamplifier section.

60. The MOPA device of claim 59 further comprising means for modulation electrical current injection into said preamplifier section.

61. The MOPA device of claim 56 wherein said laser oscillator has a high Q cavity and further comprising means for modulating said laser oscillator.

62. A monolithically integrated, master oscillator power amplifier (MOPA) device comprising a semiconductor laser diode formed on a substrate, and an optical amplifier formed on said substrate and having a single mode preamplifier section optically coupled to said laser diode and an amplifier section optically coupled to said preamplifier section, said amplifier section having a width at an output end thereof distal from said preamplifier section which is greater than a width of an output end of said laser diode, wherein said amplifier section has means for electrically exciting said output end of said amplifier section with a greater current density than a current density applied to an input end of said amplifier section proximate to said preamplifier section.

63. The MOPA device of claim 62 wherein said laser diode includes at least one optical feedback grating.

64. The MOPA device of claim 62 wherein said laser diode has means for tuning the wavelength of light output from said laser diode.

65. The MOPA device of claim 62 wherein said preamplifier section is electrically excited with a different current density than a current density applied to said amplifier section.

66. The MOPA device of claim 62 wherein said amplifier section has means for electrically exciting said amplifier section with current densities that vary both longitudinally and laterally over said amplifier section.

67. The MOPA device of claim 62 wherein said amplifier section has means for at least partially reducing divergence of the laterally diverging light within said amplifier.

68. The MOPA device of claim 67 wherein said divergence reducing means comprises at least one lens element.

69. The MOPA device of claim 68 wherein said lens element is induced by current selectively injected into a lens shaped region of said amplifier section.

70. The MOPA device of claim 62 wherein said single mode preamplifier section is characterized by a lateral taper in which an input aperture of said preamplifier section proximate to said laser diode is wider than an output aperture of said preamplifier section proximate to said amplifier section.

71. The MOPA device of claim 62 wherein said single mode preamplifier is wider at an output end thereof proximate to said amplifier section than an input end of said preamplifier proximate to said laser diode.

72. The MOPA device of claim 62 wherein at least said optical amplifier is mounted onto a heat sink with a diamond material surface.

73. The MOPA device of claim 62 wherein an output surface proximate to an output end of said amplifier section is oriented at a nonperpendicular angle relative to a direction of light propagation in said amplifier section.

74. The MOPA device of claim 62 further comprising means for coupling amplified light from said amplifier section vertically out through a surface of the device.

75. The MOPA device of claim 74 wherein said coupling means comprises a transversely reflecting angled mirror surface at an output end of said amplifier section.

76. The MOPA device of claim 74 wherein said coupling means comprises a detuned grating formed at an output end of said amplifier section.

77. The MOPA device of claim 62 wherein said single mode preamplifier section comprises a branching network of single mode waveguides, said multimode amplifier section including an array of substantially identical flared amplifiers positioned at an output of each branched waveguide.

78. The MOPA device of claim 62 wherein said preamplifier section of said optical amplifier is reverse biased during at least a portion of the time of operation of the device.

79. The MOPA device of claim 62 wherein said multimode amplifier section is a flared amplifier section with a wider output end than its input end.

80. The MOPA device of claim 79 wherein said optical amplifier has means for electrically exciting the wider output end of said flared amplifier section with a greater current density than its input end.

81. The MOPA device of claim 79 wherein said optical amplifier has means for electrically exciting said flared amplifier section with current densities that vary both longitudinally and laterally over said flared amplifier section.

82. The MOPA device of claim 62 wherein said amplifier section has at least one electrical bias means separate from another electrical bias means for said laser diode, and wherein the MOPA device further comprises optical detection means for sensing nonlinear optical power output from said amplifier section versus current applied through said electrical bias means to said laser diode and said amplifier section, and electronic control means for feeding back an electrical signal corresponding to said sensed nonlinear optical power into at least one of said electrical bias means of said amplifier section.

83. The MOPA device of claim 82 wherein said fed back electrical signal is selected by said electronic control means to improve linearity of said optical power output versus current.

84. The MOPA device of claim 82 wherein current applied through one of said electrical bias means is amplitude modulated.

85. The MOPA device of claim 62 wherein said input end of said amplifier section has a zero current density applied thereto, said input end of said amplifier being unbiased.

86. The MOPA device of claim 62 wherein a lens is formed on said substrate proximate to an output end of said amplifier section.

87. A master oscillator power amplifier (MOPA) device comprising
- a single transverse mode laser oscillator formed on a substrate,
- an optical preamplifier section formed on said substrate, said preamplifier having a single mode waveguide coupled to said laser oscillator to receive light emitted therefrom, and
- a flared optical amplifier formed on said substrate, said amplifier having a gain region with an input end optically coupled to said preamplifier to receive light at said first intensity level and an output end providing an amplified light output beam at a second intensity level, said amplifier having means for applying a greater current density to said output end than to said input end thereof, said gain region of said flared amplifier having a width that increases with distance from a first width at said input end to a substantially larger second width at said output end, said gain region width increasing at a rate at least equaling a rate of divergence of light propagating within said amplifier.

88. The MOPA device of claim 87 wherein said laser oscillator is a DBR oscillator having a gain section and a pair of distributed Bragg reflector (DBR) gratings bounding said gain section at respective front and rear ends of said gain section.

89. The MOPA device of claim 88 wherein said DBR oscillator is tunable to a selected wavelength, at least one of said pair of DBR gratings having current injection means associated therewith for changing a wavelength reflection response thereof.

90. The MOPA device of claim 88 wherein said DBR gratings are first order gratings.

91. The MOPA device of claim 88 wherein said DBR gratings are second order gratings.

92. The MOPA device of claim 87 further comprising detector means formed on said substrate for monitoring optical power.

93. The MOPA device of claim 87 wherein said gain region comprises a strained layer semiconductor.

94. The MOPA device of claim 87 wherein said amplifier gain region has a first width at said input end that is substantially larger than the waveguide width at the output of said preamplifier.

95. The MOPA device of claim 87 wherein said waveguide of said preamplifier has a width that is tapered from a third width at a receiving end of said waveguide to a fourth width at an emitting end of said waveguide.

96. The MOPA device of claim 95 wherein said fourth width of said preamplifier waveguide is narrower than said third width.

97. The MOPA device of claim 87 wherein said width of said gain region of said flared amplifier increases linearly with distance from said preamplifier.

98. The MOPA device of claim 87 wherein said width of said gain region of said flared amplifier increases as the square of the distance from said preamplifier.

99. The MOPA device of claim 87 wherein a transparent window region is disposed adjacent to an output facet that is located proximate to an output end of said flared amplifier.

100. The MOPA device of claim 87 further comprising means for coupling the amplified light output beam from said flared amplifier vertically out through a top surface of the device.

101. The MOPA device of claim 100 wherein said coupling means comprises a transversely reflecting angled mirror surface at said output end of said flared amplifier.

102. The MOPA device of claim 100 wherein said coupling means comprises a detuned grating formed at said output end of said flared amplifier.

103. The MOPA device of claim 87 wherein a lens is formed on said substrate proximate to an output end of said flared amplifier.

104. A monolithically integrated, master oscillator power amplifier (MOPA) device comprising
- a semiconductor laser diode formed on a substrate, and
- an optical amplifier formed on said substrate and having a single mode preamplifier section optically coupled to said laser diode and an amplifier section optically coupled to said preamplifier section, wherein said amplifier section has an input aperture proximate to said preamplifier section which is larger than an output aperture of said preamplifier section.

105. A master oscillator power amplifier (MOPA) device comprising
- a single transverse mode laser oscillator formed on a substrate,
- an optical preamplifier section formed on said substrate, said preamplifier having a single mode waveguide coupled to said laser oscillator to receive light emitted at a first intensity level from said laser oscillator, and
- a flared optical amplifier formed on said substrate, said amplifier having a gain region with an input end optically coupled to said preamplifier to receive light at a second intensity level from said preamplifier, wherein a longitudinal axis in a direction of light propagation through said laser oscillator, preamplifier and flared amplifier is oriented at a nonperpendicular angle relative to an output surface proximate to said output end of said flared amplifier.

106. A master oscillator power amplifier (MOPA) device comprising
- a single transverse mode laser oscillator formed on a substrate,
- an optical preamplifier section formed on said substrate, said preamplifier having a single mode waveguide coupled to said laser oscillator to receive light emitted therefrom, said preamplifier also having gain means associated with said single mode waveguide for amplifying said received light, and
- a flared optical amplifier formed on said substrate, said amplifier having a gain region with an input end optically coupled to said preamplifier to receive light at said first intensity level,
- wherein said preamplifier comprises a branching network of single mode waveguides, said device including an array of substantially identical flared amplifiers positioned at an output of each branched waveguide.

107. A monolithically integrated, master oscillator power amplifier (MOPA) device comprising
- a semiconductor laser diode formed on a substrate, said laser diode having a high Q cavity and means for modulating said laser diode, and an optical amplifier formed on said substrate and having an amplifier section optically coupled to said laser diode, said amplifier section having a width at an output end thereof distal from said laser diode which is greater than a width of an output end of said laser diode, said amplifier section having means for applying a greater current density to said output end of said amplifier section than to an input end of said amplifier section proximate to said laser diode.

108. The MOPA device of claim 107 wherein said optical amplifier also has a single mode preamplifier section optically coupled between an output end of said laser diode and an input end of said amplifier section.

109. The MOPA device of claim 108 wherein said high Q cavity of said laser diode has a first mirror adjacent to said preamplifier section of said optical amplifier and a second mirror opposite from said preamplifier section, said first mirror having greater than 40% reflectivity, said second mirror having near 100% reflectivity.

110. A monolithically integrated, master oscillator power amplifier (MOPA) device comprising a semiconductor laser diode formed on a substrate, and an optical amplifier formed on said substrate and having a single mode preamplifier section optically coupled to said laser diode and an amplifier section optically coupled to said preamplifier section, said amplifier section having a width at an output end thereof distal from said preamplifier section which is greater than a width of an output end of said laser diode, wherein at least said amplifier section of said optical amplifier has a transverse waveguiding structure such that less than 5% of the total intensity of the guided optical wave overlaps an active light amplifying region of said structure.

111. The MOPA device of claim 110 wherein said transverse waveguiding structure has asymmetric light guiding characteristics.

112. A master oscillator power amplifier (MOPA) device comprising a DBR laser oscillator having a single mode gain section formed on a substrate and a pair of distributed Bragg reflector (DBR) gratings bounding said gain section at respective front and rear ends of said gain section, an optical preamplifier having a single mode waveguide formed on said substrate and coupled to said laser oscillator to receive light emitted therefrom, said waveguide of said preamplifier characterized by a mode width that tapers from a first width at an input end of said preamplifier that substantially matches a mode width of said laser oscillator to a narrow second width at an output end of said preamplifier, said preamplifier also having gain means associated with said single mode waveguide for amplifying said received light, and a flared optical power amplifier having a gain region formed on said substrate with an input end optically coupled to said output end of said preamplifier to receive light and with an output end providing an amplified light output beam, said input end of said amplifier characterized by a mode width that substantially matches said second width at said output end of said preamplifier, the mode width of said gain region of said amplifier increasing with distance from said preamplifier at a rate at least equaling a rate of divergence of light propagating within said amplifier to a substantially larger third width at said output end of said gain region.

113. A master oscillator power amplifier (MOPA) device comprising a semiconductor laser oscillator, an optical amplifier optically coupled to said laser oscillator, said amplifier having at least one electrical contact separate from another electrical contact for said laser oscillator, and electronic control means for providing at least two electrical bias signals of different frequencies to at least two separate electrical contacts on said amplifier and laser oscillator.

114. The MOPA device of claim 113 wherein said different frequencies are selected to produce high frequency harmonics of said at least two electrical bias signals.

115. A monolithic semiconductor master oscillator power amplifier (MOPA) device comprising a laser oscillator formed on a substrate, an optical power amplifier formed on said substrate and optically coupled to said laser oscillator, and optical feedback means located between said laser oscillator and said amplifier in a region of said laser oscillator where a width of a lateral waveguide of said laser oscillator is changed relative to a width of said lateral waveguide in another region of said laser oscillator.

116. The MOPA device of claim 115 wherein said feedback means is grating.

117. The MOPA device of claim 116 wherein said grating is curved.

118. The MOPA device of claim 115 wherein said feedback means is a microcleave.

119. The MOPA device of claim 115 wherein said feedback means is located in a multimode region of said laser oscillator.

120. The MOPA device of claim 115 wherein said feedback means is located in a region of said laser oscillator where the width of said lateral waveguide is expanding.

121. The MOPA device of claim 115 wherein said feedback means is located in a region of said laser oscillator where the width of said lateral waveguide is narrowing.

122. The MOPA device of claim 115 wherein said feedback means forms an unstable resonator cavity for said laser oscillator.

123. The MOPA device of claim 115 wherein said feedback means forms a stable resonator cavity for said laser oscillator.

124. The MOPA device of claim 115 wherein said amplifier is a multimode amplifier.

125. The MOPA device of claim 115 wherein said amplifier is a flared amplifier.

126. The MOPA device of claim 115 wherein said amplifier converges along at least a portion of its length.

127. The MOPA device of claim 115 wherein said amplifier is differentially pumped.

128. The MOPA device of claim 115 wherein said laser oscillator and said amplifier are separately pumped.

129. A semiconductor master oscillator power amplifier (MOPA) device comprising a laser oscillator having a waveguide between two distributed Bragg reflector (DBR) elements providing optical feedback to said waveguide, said waveguide of said laser oscillator having a narrow emission aperture at one end thereof, an optical power amplifier optically coupled to said laser oscillator to receive a diverging light beam from said narrow emission aperture of said laser oscillator, said amplifier having a width allowing said light beam to continue diverging within said amplifier, said amplifier having a low reflectivity surface at an output end thereof, and means for differentially pumping said amplifier such than an input end of said amplifier proximate to said narrow emission aperture of said laser oscillator is excited by said pumping means to a lesser extent than said output end of said amplifier, whereby any light reflected from said low reflectivity surface back toward said laser oscillator has reduced amplification and continues to diverge within said amplifier for reduced feedback into said laser oscillator.

130. A monolithic semiconductor master oscillator power amplifier (MOPA) device comprising a laser oscillator formed on a substrate, a optical power amplifier formed on said substrate and optically coupled to said laser oscillator, said amplifier having a width at an output end thereof distal from said laser oscillator which is greater than a width of an output end of said laser oscillator, and means for altering the divergence of light from said laser oscillator entering said amplifier.

131. The MOPA device of claim 130 wherein said divergence altering means is a lateral waveguide in said laser oscillator having a region of decreased width.

132. The MOPA device of claim 130 wherein said divergence altering means is a lateral waveguide in said laser oscillator having a region of increased width.

133. The MOPA device of claim 130 wherein said divergence altering means is a preamplifier located between said laser oscillator and said amplifier with a lateral waveguide of decreased width.

134. The MOPA device of claim 130 wherein said divergence altering means is a preamplifier located between said laser oscillator and said amplifier with a lateral waveguide of increased width.

135. The MOPA device of claim 130 wherein said divergence altering means is a curved grating reflector for said laser oscillator.

136. A monolithic semiconductor master oscillator power amplifier (MOPA) device comprising a laser oscillator formed on a substrate, an optical power amplifier formed on said substrate and optically coupled to said laser oscillator, said amplifier having a region for beam propagation and beam expansion, and means formed on said substrate for altering the amount of beam expansion in said amplifier region.

137. The MOPA device of claim 136 wherein said expansion altering means is a lens.

138. The MOPA device of claim 137 wherein said lens is induced by current selectively injected into a lens shaped region of said amplifier.

139. The MOPA device of claim 136 wherein said expansion altering means is a lateral waveguide in said amplifier region.

140. The MOPA device of claim 136 wherein said expansion altering means collimates the beam propagating in said amplifier region.

141. The MOPA device of claim 136 wherein said expansion altering means causes the beam propagating in said amplifier region to converge.

142. The MOPA device of claim 136 wherein said expansion altered beam continues to diverge in said amplifier region.

* * * * *

UNITED STATES PATENT AND TRADEMARK OFFICE
CERTIFICATE OF CORRECTION

PATENT NO. : 5,539,571
DATED : Jul. 23, 1996
INVENTOR(S) : David F. Welch et al.

Figure 17A:
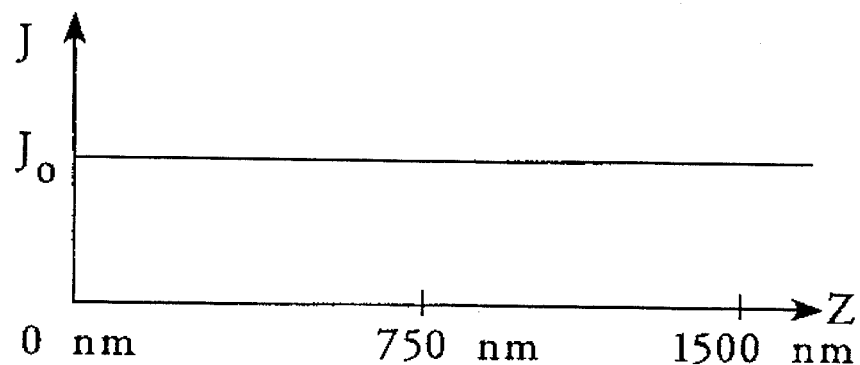
FIGS. 17a–c are graphs of current density versus amplifier position for three pumping profiles in accord with the present invention.
Figure 17B:
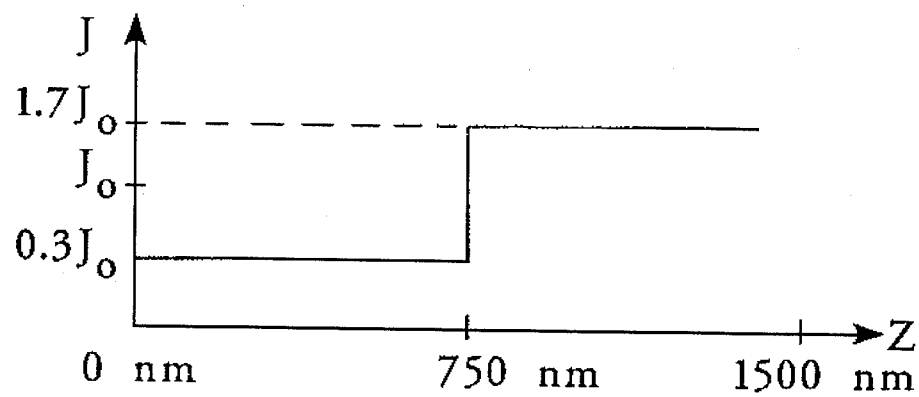
Figure 17C:
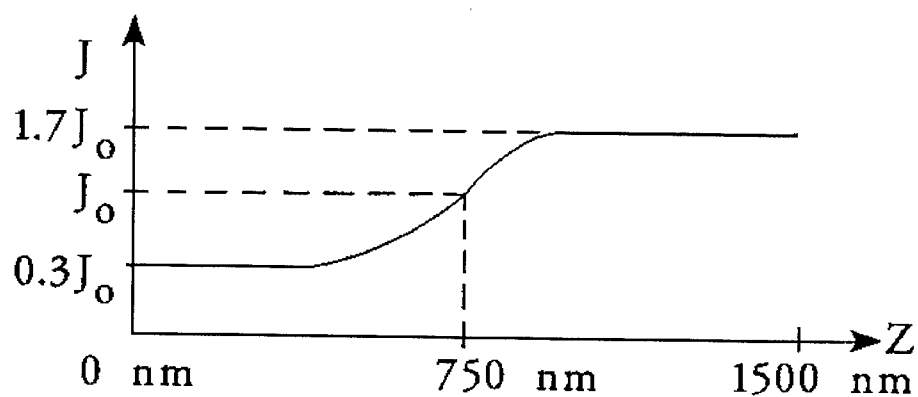

It is certified that error appears in the above-indentified patent and that said Letters Patent is hereby corrected as shown below:

Sheet 6 of 13 in the drawings, FIG. 17a, FIG. 17b and FIG. 17c, all occurrences of "nm" should be -- $\mu$m --.

Column 1, line 6, "ADD" should read -- AND --.

Column 1, line 16, "7/948,673" should read -- 07/948,673 --.

Column 9, line 18, "101" should read -- 1011 --.

Column 9, line 21, "$I_1 - 1_4$" should read -- $I_1 - I_4$ --.

Column 13, lines 7-8, "FIG. 25" should read -- FIG. 24 --.

Column 14, line 54, "FIG 35a" should read -- FIG. 35e --.

Column 15, line 1, "FIG 35fa single" should read -- FIG 35f, a single --.

UNITED STATES PATENT AND TRADEMARK OFFICE
CERTIFICATE OF CORRECTION

PATENT NO. : 5,539,571
DATED : Jul. 23, 1996
INVENTOR(S) : David F. Welch et al.

It is certified that error appears in the above-indentified patent and that said Letters Patent is hereby corrected as shown below:

Claim 5, column 16, line 38, "2" should read --3--.

Signed and Sealed this

Twelfth Day of August, 1997

Attest:

Attesting Officer

BRUCE LEHMAN

Commissioner of Patents and Trademarks